(12) United States Patent
Furuta et al.

(10) Patent No.: US 9,312,873 B2
(45) Date of Patent: Apr. 12, 2016

(54) ANALOG-TO-DIGITAL CONVERTER AND IMAGE SENSOR

(71) Applicant: Kabushiki Kaisha Toshiba, Minato-ku (JP)

(72) Inventors: Masanori Furuta, Odawara (JP); Kei Shiraishi, Fuchu (JP); Yasuhiro Shinozuka, Fuchu (JP)

(73) Assignee: KABUSHIKI KAISHA TOSHIBA, Minatu-ku (JP)

( * ) Notice: Subject to any disclaimer, the term of this patent is extended or adjusted under 35 U.S.C. 154(b) by 0 days.

(21) Appl. No.: 14/589,138

(22) Filed: Jan. 5, 2015

(65) Prior Publication Data

US 2015/0194973 A1   Jul. 9, 2015

(30) Foreign Application Priority Data

Jan. 8, 2014   (JP) ................................. 2014-001481

(51) Int. Cl.
| | |
|---|---|
| *H03M 1/00* | (2006.01) |
| *H04N 5/374* | (2011.01) |
| *H04N 5/3745* | (2011.01) |
| *G04F 10/00* | (2006.01) |
| *H03M 1/34* | (2006.01) |

(52) U.S. Cl.
CPC .............. *H03M 1/002* (2013.01); *G04F 10/005* (2013.01); *H03M 1/34* (2013.01); *H04N 5/3742* (2013.01); *H04N 5/37455* (2013.01)

(58) Field of Classification Search
CPC ...... H03M 1/002; H03M 1/34; H04N 5/3742; H04N 5/37455; G06F 10/005
See application file for complete search history.

(56) References Cited

U.S. PATENT DOCUMENTS

| | | | |
|---|---|---|---|
| 3,316,547 A | 4/1967 | Ammann | |
| 8,314,868 B2* | 11/2012 | Yamamoto | ............... H03K 4/02 327/100 |
| 8,558,729 B2 | 10/2013 | Tanaka | |

(Continued)

FOREIGN PATENT DOCUMENTS

| | | |
|---|---|---|
| JP | 2011-254246 A | 12/2011 |
| JP | 2012-204842 A | 10/2012 |

OTHER PUBLICATIONS

Tomohiro Takahashi, et al., "A Digital CDS Scheme on Fully Column-Inline TDC Architecture for an APS-C Format CMOS Image Sensor" 2011 Symposium on VLSI Circuits Digest of Technical Papers, 2011, pp. 90-91.

(Continued)

*Primary Examiner* — Aung S Moe
(74) *Attorney, Agent, or Firm* — Oblon, McClelland, Maier & Neustadt, L.L.P.

(57) ABSTRACT

An analog-to-digital converter has a sampler to hold a sampled signal, an input signal predictor to generate a prediction signal at predetermined timing before a signal level of a ramp signal that monotonically increases or monotonically decreases with time crosses a signal level of the sampled signal, a comparator to compare signal levels of the ramp signal and the sampled signal to output a comparison signal showing whether the signal level of the ramp signal is larger than the signal lever of the sampled signal, a first counter to perform a count operation in synchronism with a first clock signal within a period from start of a comparison operation by the comparator to generation of the prediction signal, and a second counter to perform a count operation in synchronism with a second clock signal.

13 Claims, 18 Drawing Sheets

(56) References Cited

U.S. PATENT DOCUMENTS

| | | | | |
|---|---|---|---|---|
| 2008/0169955 A1* | 7/2008 | Inada | ............ | H03M 1/1023 341/156 |
| 2011/0292265 A1 | 12/2011 | Takahashi et al. | | |
| 2013/0077445 A1* | 3/2013 | Um | ............ | G10K 11/346 367/135 |
| 2015/0009386 A1* | 1/2015 | Komaba | ............ | H03M 1/56 348/308 |
| 2015/0028190 A1* | 1/2015 | Shin | ............ | H03K 21/38 250/208.1 |
| 2015/0062393 A1* | 3/2015 | Komaba | ............ | H04N 5/374 348/300 |

OTHER PUBLICATIONS

Takayuki Toyama, et al., "A 17.7Mpixel 120fps CMOS Image Sensor with 34.8Gb/s Readout" 2011 IEEE International Solid-State Circuits Conference, 2011, pp. 420-422.

Muung Shin, et al., "Column Parallel Single-Slope ADC with Time to Digital Converter for CMOS Imager" ICECS 2010, 2010, pp. 863-866.

* cited by examiner ically increases or monotonically decreases with time crosses a signal level of the sampled signal, a comparator to compare signal levels of the ramp signal and the sampled signal to output a comparison signal showing whether the signal level of the ramp signal is larger than the signal lever of the sampled signal, a first counter to perform a count operation in synchronism with a first clock signal within a period from start of a comparison operation by the comparator to generation of the prediction signal, and a second counter to perform a count operation in synchronism with a second clock signal having a higher frequency than the first clock signal after the generation of the prediction signal and to increase or decrease a count value in accordance with the comparison signal.

ANALOG-TO-DIGITAL CONVERTER AND IMAGE SENSOR

CROSS REFERENCE TO RELATED APPLICATIONS

This application is based upon and claims the benefit of priority from the prior Japanese Patent Application No. 2014-1481, filed on Jan. 8, 2014, the entire contents of which are incorporated herein by reference.

FIELD

Embodiments of the present invention relate to an integral analog-to-digital converter and an image sensor provided with the analog-to-digital converter.

BACKGROUND

An integral analog-to-digital converter (ADC) using a time-to-digital converter (TDC) has been proposed. This type of integral ADC performs fine A/D conversion using TDC in addition to coarse A/D conversion using a ramp signal to increase the resolution of A/D conversion and speed up the A/D conversion.

However, TDC requires a high-speed clock signal. Thus, if a high-speed clock signal is supplied to TDC while performing coarse A/D conversion using a ramp signal, a consumption power increases.

Moreover, different clock signals are used for coarse A/D conversion using a ramp signal and fine A/D conversion using TDC. Thus, A/D conversion performance may be lowered due to phase difference between both clock signals.

DETAILED DESCRIPTION

An analog-to-digital converter according to one embodiment has a sampler to hold a sampled signal obtained by sampling an input signal for each specific time, an input signal predictor to generate a prediction signal at predetermined timing before a signal level of a ramp signal that monotonically increases or monotonically decreases with time crosses a signal level of the sampled signal, a comparator to compare signal levels of the ramp signal and the sampled signal to output a comparison signal showing whether the signal level of the ramp signal is larger than the signal lever of the sampled signal, a first counter to perform a count operation in synchronism with a first clock signal within a period from start of a comparison operation by the comparator to generation of the prediction signal, and a second counter to perform a count operation in synchronism with a second clock signal having a higher frequency than the first clock signal after the generation of the prediction signal and to increase or decrease a count value in accordance with the comparison signal.

Embodiments will now be explained with reference to the accompanying drawings.

First Embodiment

Figure 1:
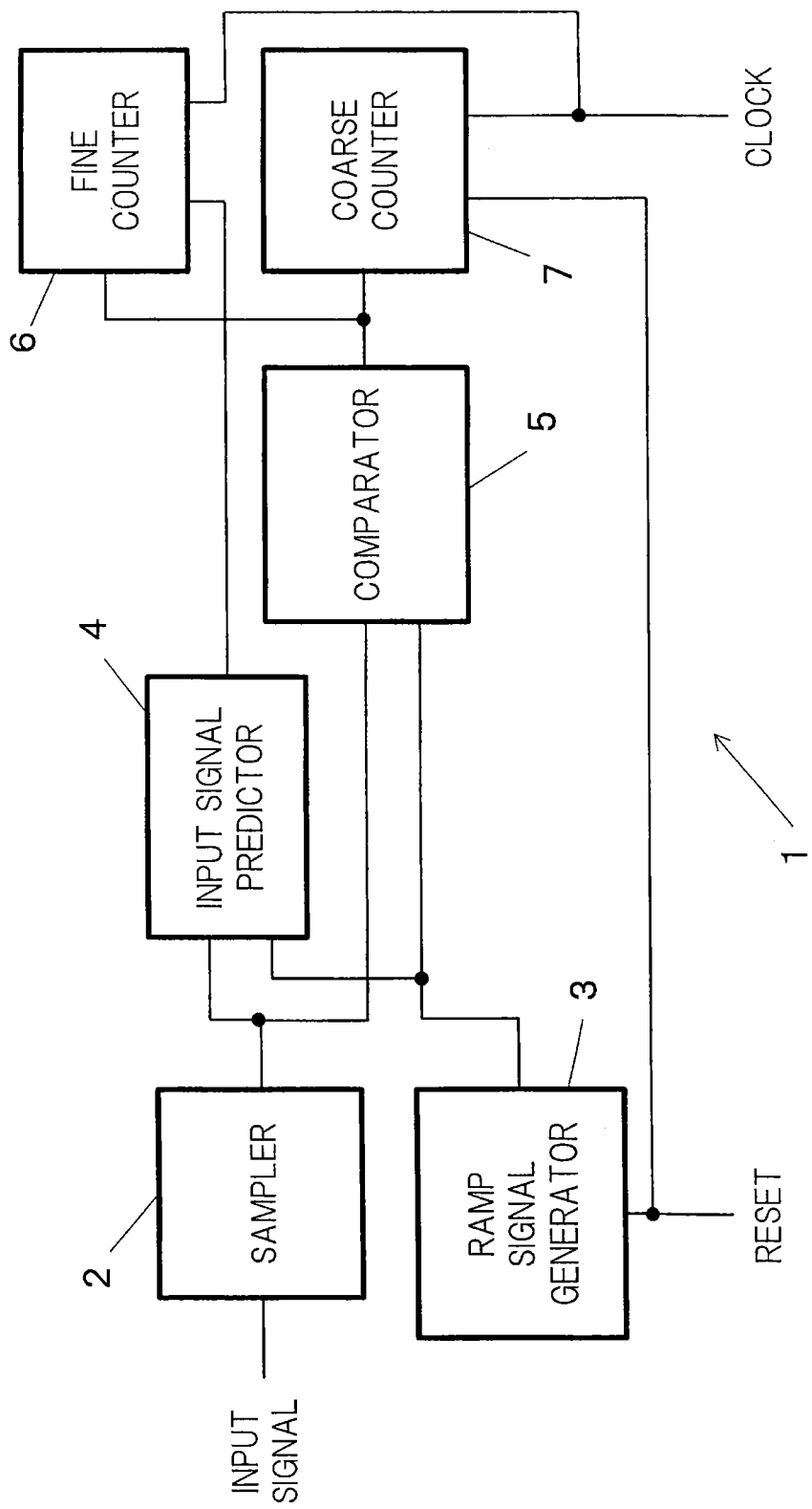
FIG. 1 is a block diagram schematically showing the configuration of an analog-to-digital converter 1 according to a first embodiment.

FIG. 1 is a block diagram schematically showing the configuration of an analog-to-digital converter 1 according to a first embodiment. The analog-to-digital converter 1 of FIG. 1 is provided with a sampler 2, a ramp signal generator 3, an input signal predictor 4, a comparator 5, a Fine counter 6, and a Coarse counter 7.

The sampler 2 holds a sampled signal obtained by sampling an input signal per specific period of time. The ramp signal generator 3 generates a ramp signal. The ramp signal is a signal whose signal level monotonically increases or decreases with time. In other words, the ramp signal is a signal whose output voltage increases by Δv while a time Δt passes or a signal whose output voltage decreases by Δv while Δt passes.

The ramp signal generator 3 may be configured with an integrator. In the case of the integrator, Δt is one clock period and Δv represents an integrated voltage within one clock period. The ramp signal generator 3 starts a ramp-signal generation operation after the integrator is released from a reset operation.

The input signal predictor 4 generates a prediction signal at a predetermined timing before the signal level of a ramp signal crosses the signal level of a sampled signal. Generation of the prediction signal means setting the prediction signal to a specific logic. The input signal predictor 4 outputs the prediction signal of the specific logic when the signal level of the ramp signal becomes closer to the signal level of the sampled signal.

The comparator 5 compares the signal level of the ramp signal and the signal level of the sampled signal to output a signal indicating a comparison result, i.e. to output a comparison signal showing whether the ramp signal is larger than the ramp signal. The comparator 5 outputs, for example, 1 when the signal level of the sampled signal becomes equal to or higher than the signal level of the ramp signal.

In more detail, the comparator 5 performs two kinds of comparison process. In the first comparison process, the comparator 5 performs a comparison process between a bias signal and a sampled signal or between a bias signal and a ramp signal. In the second comparison process, the comparator 5 performs a comparison process between a ramp signal and a sampled signal.

The Coarse counter 7 performs a count operation (for example, a count-up operation) in synchronism with a first clock signal within a period from the start of a comparison operation by the comparator 5 to the generation of a prediction signal. The Coarse counter 7 starts a count operation when released from a reset mode in response to a reset signal whose logic has changed into a specific logic. The Coarse counter 7 stops the count operation and holds a count value counted just before the stoppage when the comparator 5 performs the second-time comparison process to detect signal level crossing of a ramp signal and a sampled signal. The held count value is a coarse A/D conversion value.

For example, it is supposed that the output of the Coarse counter 7 is ADO when the ramp signal has an inclination of Vref[V]/T[μsec] and the first clock signal has a frequency of $2^N$/T[μsec]. A ramp signal voltage Vramp (ADO) when the output of the Coarse counter 7 is ADO is expressed by the following formula (1).

$$Vramp(ADO) = (\text{ramp signal inclination}) * (1 / \text{clock frequency}) * \quad (1)$$
$$(\text{Coarse 7 output})$$
$$= Vref / T * (T * (ADO / 2^N))$$
$$= Vref * (ADO / 2^N)$$

After the prediction signal is generated, the Fine counter 6 performs a count operation in synchronism with a second clock signal having a higher frequency than the first clock signal and increases or decreases a count value in accordance with a comparison result (comparison signal) of the comparator 5.

The Fine counter 6 has stopped a count operation until the signal level of a sampled signal becomes closer to the signal level of a ramp signal. However, the Fine counter 6 starts a count operation when the prediction signal is generated, indicating that the signal level of the sampled signal becomes closer to the signal level of the ramp signal.

The Fine counter 6 performs a count operation at a higher speed than the Coarse counter 7, and hence consumes more power than the Coarse counter 7. However, the Fine counter 6 performs a count operation for a shorter period than the Coarse counter 7. Therefore, an increase in power consumed by the Fine counter 6 can be suppressed.

Figure 2:
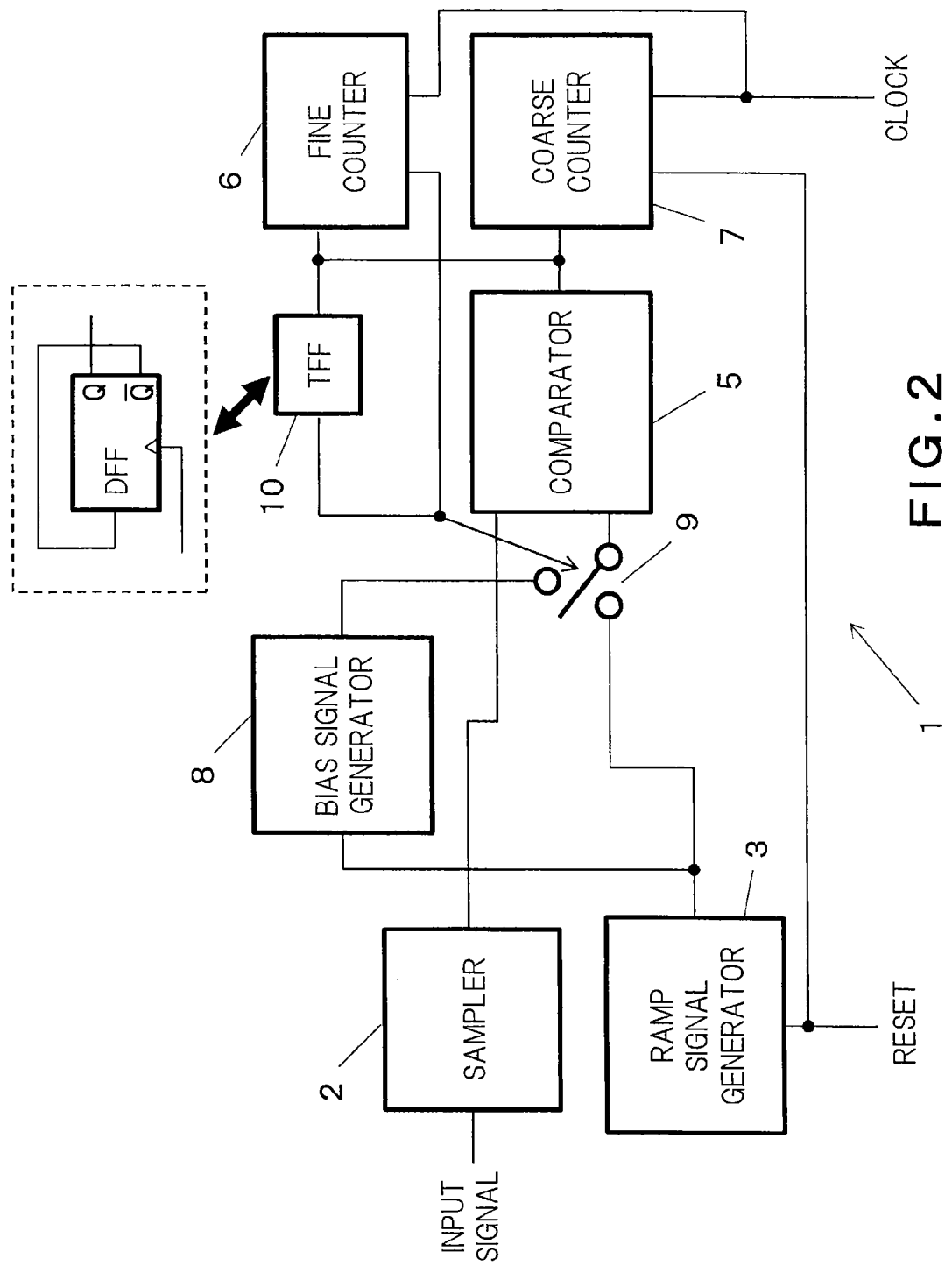
FIG. 2 is a block diagram showing a detailed concrete example of the analog-to-digital converter 1 according to a first embodiment.
Figure 3:
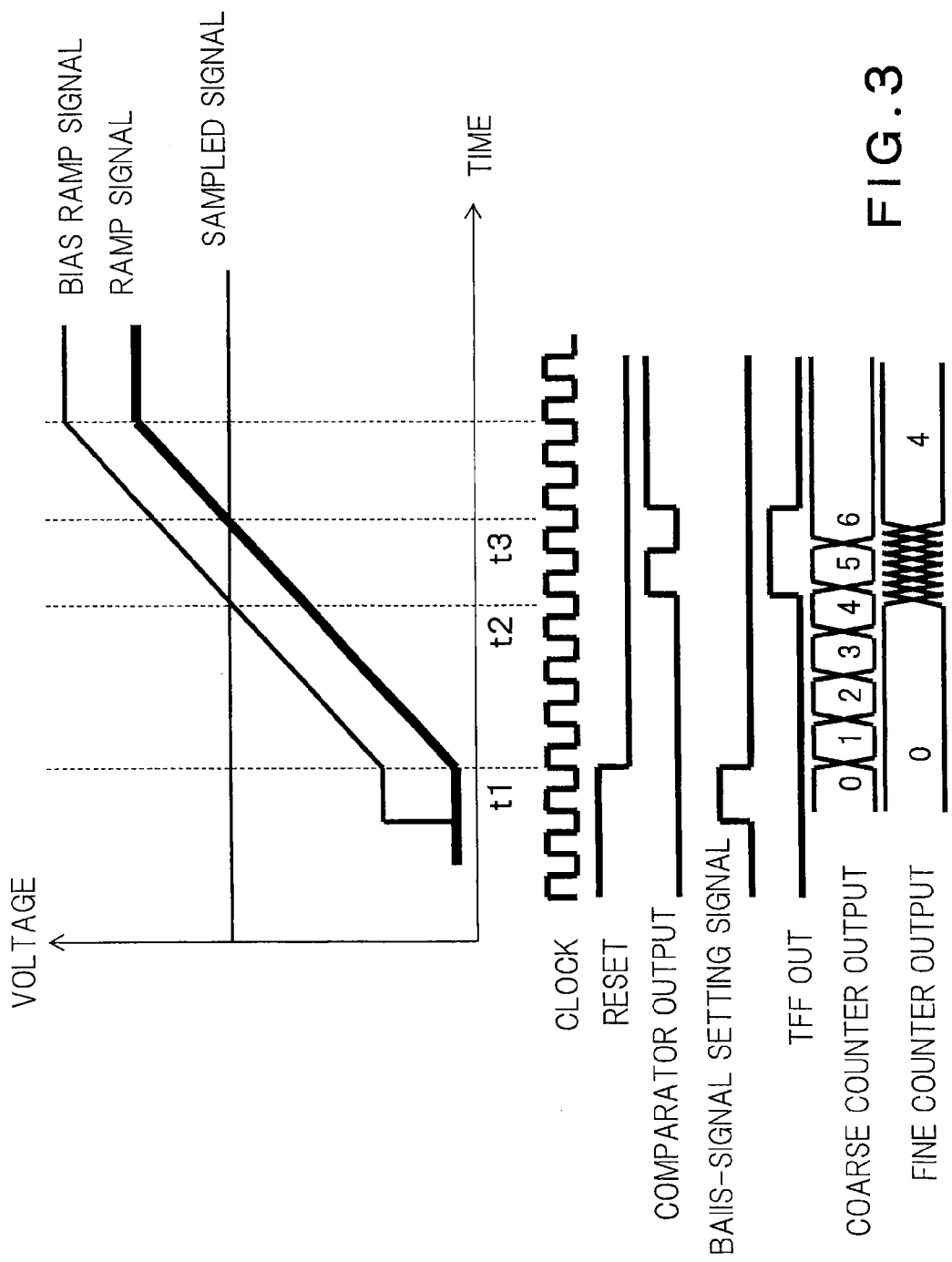
FIG. 3 is a chart of signal waveforms of the analog-to-digital converter 1 of FIG. 2.

FIG. 2 is a block diagram showing a detailed concrete example of the analog-to-digital converter 1 according to the first embodiment. FIG. 3 is a chart of signal waveforms of the analog-to-digital converter 1 of FIG. 2.

The analog-to-digital converter 1 of FIG. 2 has a bias signal generator 8, a signal switch 9, and a toggle circuit 10, as the internal configuration of the input signal predictor 4 of FIG. 1.

The bias signal generator 8 generates a bias signal obtained by converting the signal level of the ramp signal generated by the ramp signal generator 3. The signal level conversion includes increasing and decreasing the signal level of the ramp signal by a specific level. However, in this specification, the bias signal generator 8 generates a bias signal obtained by increasing the signal level of the ramp signal by a specific level, as shown in FIG. 3.

As shown in FIG. 2, a reset signal is input to the ramp signal generator 3 and the Coarse counter 7. The ramp signal generator 3 and the Coarse counter 7 are released from a reset mode at time t1 of FIG. 3. After time t1, the ramp signal generator 3 generates the ramp signal and the Coarse counter 7 starts a count operation.

Based on a signal logic held by the toggle circuit 10, the signal switch 9 is switched to select either one of the ramp signal generated by the ramp signal generator 3 and the bias signal generated by the bias signal generator 8 and supplies the selected signal to the comparator 5.

At time t1, the toggle circuit 10 outputs a low-level output signal, so that the signal switch 9 selects the bias signal and then the comparator 5 compares the bias signal and a sampled signal. As described above, the bias signal is obtained by raising the signal level of the ramp signal. Thus, the signal levels of the bias signal and the sampled signal cross each other at a higher timing than the signal levels of the ramp signal and the sampled signal. In other words, this means that the timing of signal level crossing of the ramp signal and the sampled signal is predicted by comparing the bias signal and the sampled signal to detect the timing of signal level crossing of the bias signal and the sampled signal. In this embodiment, at the moment when signal levels of the bias signal and the sampled signal cross each other, the input signal predictor 4 generates the prediction signal. This prediction signal is generated while the toggle circuit 10 is outputting a high-level output signal. In this way, the predetermined timing is set by the signal level of the bias signal.

The toggle circuit 10 inverts the initial signal and holds the inverted signal when the comparator 5 outputs a signal whose logic has changed into a specific logic indicating a comparison result (comparison signal), that is an output signal of the comparator 5 at the timing when signal levels of the bias signal and the sampled signal cross each other. The initial signal is, for example, at a low level. The toggle circuit 10 inverts the low-level initial signal to output a high-level signal when the comparator 5 outputs a signal whose logic has changed into a specific logic. The toggle circuit 10 may be configured with a toggle flip-flop (TFF), a D flip-flop (DFF), etc.

In the example of FIG. 3, signal levels of the bias signal and the sampled signal cross at time t2 and then the comparator 5 outputs a high-level signal. When the comparator 5 outputs a high-level signal, the toggle circuit 10 holds its level to output a high-level signal.

The signal held by the toggle circuit 10 is used as a signal for the Fine counter 6 to start a count operation, that is, a signal for the Fine counter 6 to be released from a reset mode. Therefore, the Fine counter 6 starts a count operation when the toggle circuit 10 performs a hold operation. FIG. 3 shows that the Fine counter 6 performs a count operation at a higher cycle than the Coarse counter 7 after time t2.

The signal held by the toggle circuit 10 is also used for signal switching by the signal switch 9. As shown in FIG. 3, at time t2, the signal switch 9 selects a ramp signal and supplies the signal to the comparator 5. Therefore, after time t2, the comparator 5 compares the signal levels of the ramp signal and the sampled signal.

Thereafter, at time t3, the signal level of the ramp signal crosses with the signal level of the sampled signal. With this signal level crossing, as shown in FIG. 3, the output logic of the comparator 5 changes again to be a high level which causes the inversion of the output logic of the toggle circuit 10. With the inversion of the output logic of the toggle circuit 10, the Fine counter 6 stops a count operation and holds the count value obtained just before the stoppage.

At time t3, the signal switch 9 selects the bias signal again. Thus, after time t3, the comparator 5 compares the signal levels of the bias signal and the sampled signal. As understood from FIG. 3, since the bias signal has a higher signal level than the sampled signal, the Coarse counter 7 does not perform a count operation after time t3.

As described above, the comparator 5 of FIG. 2 performs signal level comparison between the ramp signal and the sampled signal, and also between the bias signal and the sampled signal. The order of a comparison process is such that the comparator 5 compares, firstly, the signal levels of the bias signal and the sampled signal, and then the signal levels of the ramp signal and the sampled signal.

In other words, the comparator 5 of FIG. 2 performs signal level comparison between the bias signal and the sampled signal, which should be basically performed inside the input signal predictor 4. Therefore, there is no necessity of providing a comparator inside the input signal predictor 4, hence the internal configuration of the input signal predictor 4 can be simplified.

Figure 4:
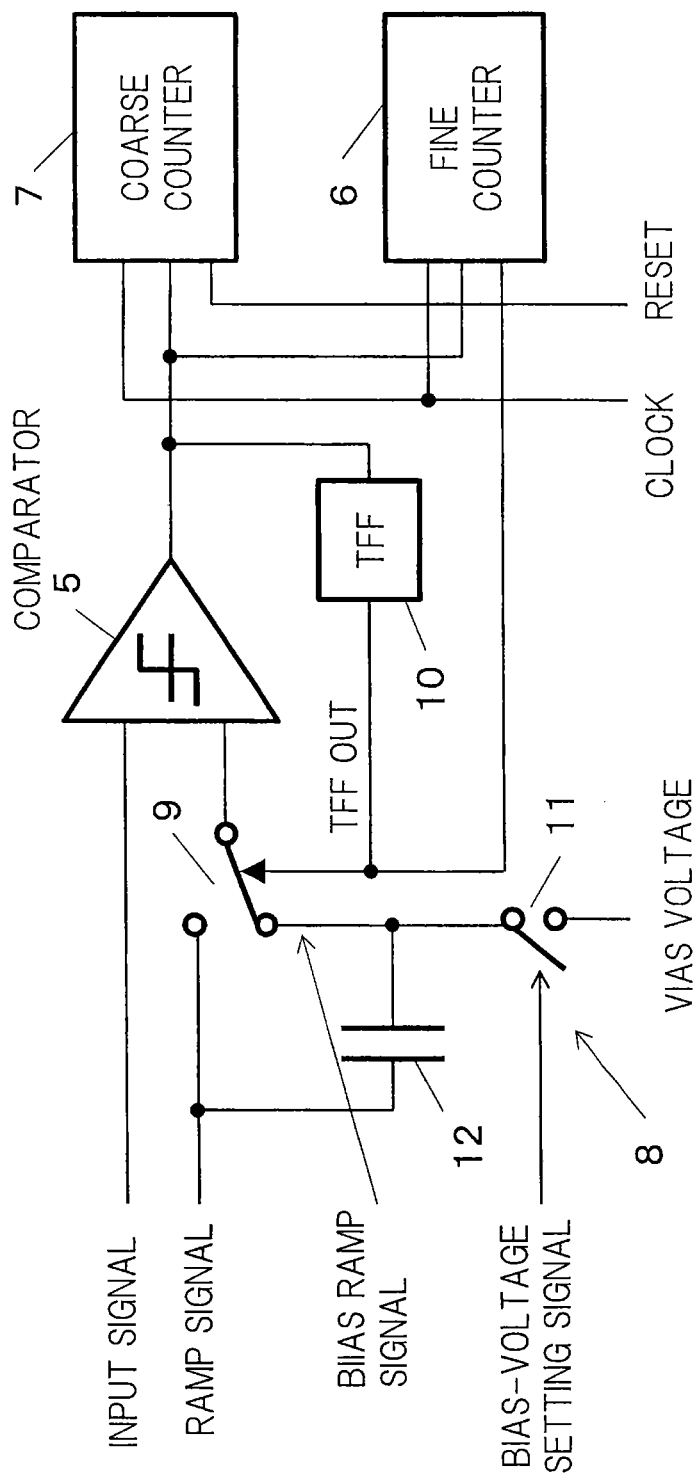
FIG. 4 is a block diagram of an analog-to-digital converter 1 that is a more concrete version of FIG. 2.

FIG. 4 is a block diagram of an analog-to-digital converter 1 that is a more concrete version of FIG. 2. In FIG. 4, a switch 11 and a capacitor 12 have the bias signal generator 8 of FIG. 2. The switch 11 switches a bias voltage to be supplied to one end of the capacitor 12 or the signal switch 9 in accordance with the logic of a bias-voltage setting signal. To the other end of the capacitor 12, the ramp signal is supplied and the signal switch 9 is connected.

In the initial state, the capacitor 12 is charged in accordance with the ramp signal. For example, when the bias-voltage setting signal becomes high, the voltage at the other end of the capacitor 12 has a voltage value obtained by the addition of a voltage of the ramp signal and the bias voltage, thereby the bias signal being generated.

In FIGS. 1 to 4, the bias voltage is generated by converting the signal level of the ramp signal. However, the bias voltage may also be generated by converting the signal level of a sampled signal.

Figure 5:
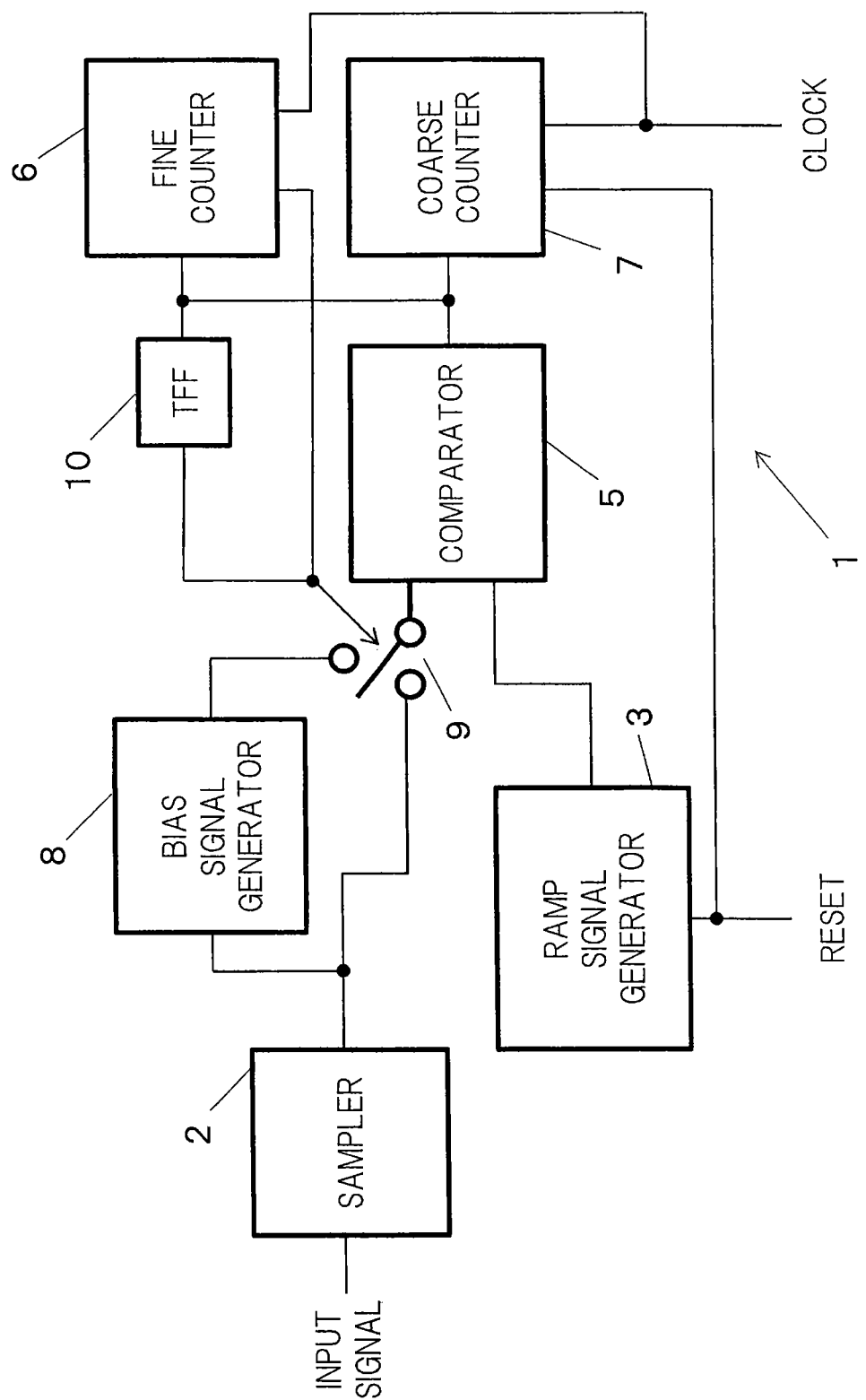
FIG. 5 is a block diagram of an analog-to-digital converter 1 according to a modified version of FIG. 1.

FIG. 5 is a block diagram of an analog-to-digital converter 1 according to a modified version of FIG. 1. A bias signal generator 8 of FIG. 5 generates a bias voltage by converting the signal level of a sampled signal. The signal switch 9 is switched to select either the sampled signal sampled by the sampler 2 or the bias signal generated by the bias signal generator 8 based on a signal logic held by the toggle circuit 10 and supplies the selected signal to the comparator 5. The comparator 5 compares the signal level of the sampled signal or bias signal selected by the signal switch 9 and the signal level of a ramp signal generated by the ramp signal generator 3.

It is required for the input signal predictor 4 to generate a prediction signal at a predetermined timing before the signal levels of the ramp signal and the sampled signal cross each other. Thus, in the case of using a ramp signal having a tendency of monotonic increase as shown in FIG. 2, the bias signal generator 8 of FIG. 5 generates the bias signal that is obtained by decreasing the signal level of the sampled signal by a specific level. In this way, at the same timing as FIG. 2, the Fine counter 6 can start a count operation after the generation of the prediction signal.

As described above, in the first embodiment, the bias signal is generated by converting the signal level of the ramp signal or sampled signal and the prediction signal is generated by detecting the timing at which the signal level of the bias signal crosses the signal level of the sampled signal or ramp signal. Before the generation of a prediction signal, the Coarse counter 7 performs a coarse A/D conversion process and, after the generation of the prediction signal, the Fine counter 6 performs a fine A/D conversion process. Accordingly, it is possible to perform a high-resolution A/D conversion process and shorten the operation time of the Fine counter 6 that operates in synchronism with a high-speed second clock signal, thereby decreasing consumed power.

Second Embodiment

Figure 6:
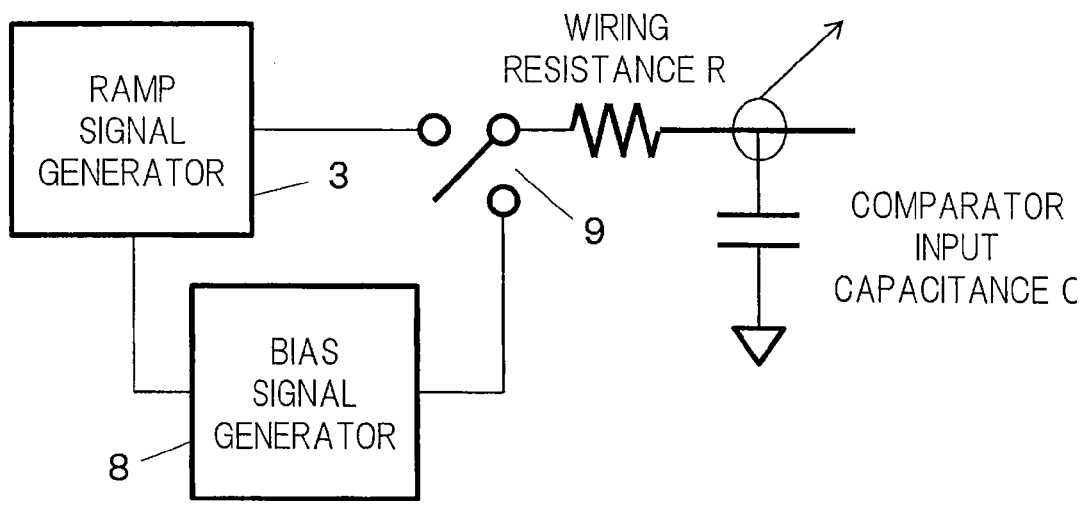
FIG. 6 is an equivalent circuit diagram of a signal path that connects a signal switch 9 and a comparator 5.
Figure 7:
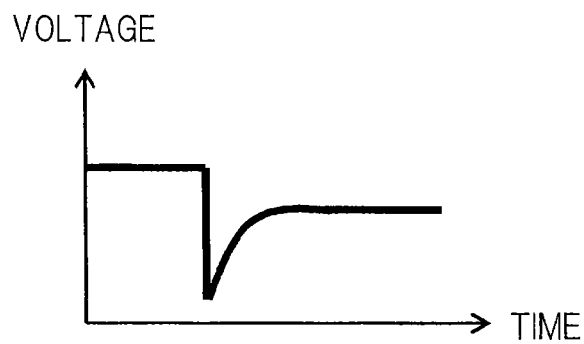
FIG. 7 is a chart of a signal waveform along the signal path that connects the signal switch 9 and the comparator 5.

When the signal switch 9 of FIG. 2 or 5 performs switching between two input signals, the input signal level of the comparator 5 may temporarily fluctuate largely. FIG. 6 is an equivalent circuit diagram of a signal path that connects the signal switch 9 and the comparator 5. FIG. 7 is a chart of a signal waveform along the signal path.

A wiring resistance R and an input capacitance C of the comparator 5 exist on the signal path that connects the signal switch 9 and the comparator 5. When the input capacitance C of the comparator 5 is large, the signal level on the signal path rapidly fluctuates due to a settling operation to charge the input capacitance C. That is, when the signal switch 9 performs signal switching and thus the signal level of a signal supplied to the comparator 5 rapidly varies, the output voltage of a low-path filter having the wiring resistance R and the input capacitance C of the comparator 5 of FIG. 6 shows step response characteristics expressed by the following formula (2).

$$\text{output voltage} = \text{difference voltage between signal levels} \times (1 - e^{t/CR}) \quad (2)$$

where t is an elapsed time, C is the input capacitance C of the comparator 5 and R is the wiring resistance R. A signal waveform of the formula (2) is such as shown in FIG. 7.

As understood from the formula (2), the time constant of the low-path filter having the wiring resistance R and the input capacitance C of the comparator 5 is decided by CR. Thus, when both of the input capacitance C and the wiring resistance R are large, the comparator 5 may output an erroneous comparison result (comparison signal) at the moment at which the Fine counter 6 starts a count operation, which gives an adverse effect to an A/D conversion performance. A fine A/D conversion process may be performed after temporary signal drop such as shown in FIG. 7 ceases, which however takes time for A/D conversion and escalates power consumption.

Figure 8:
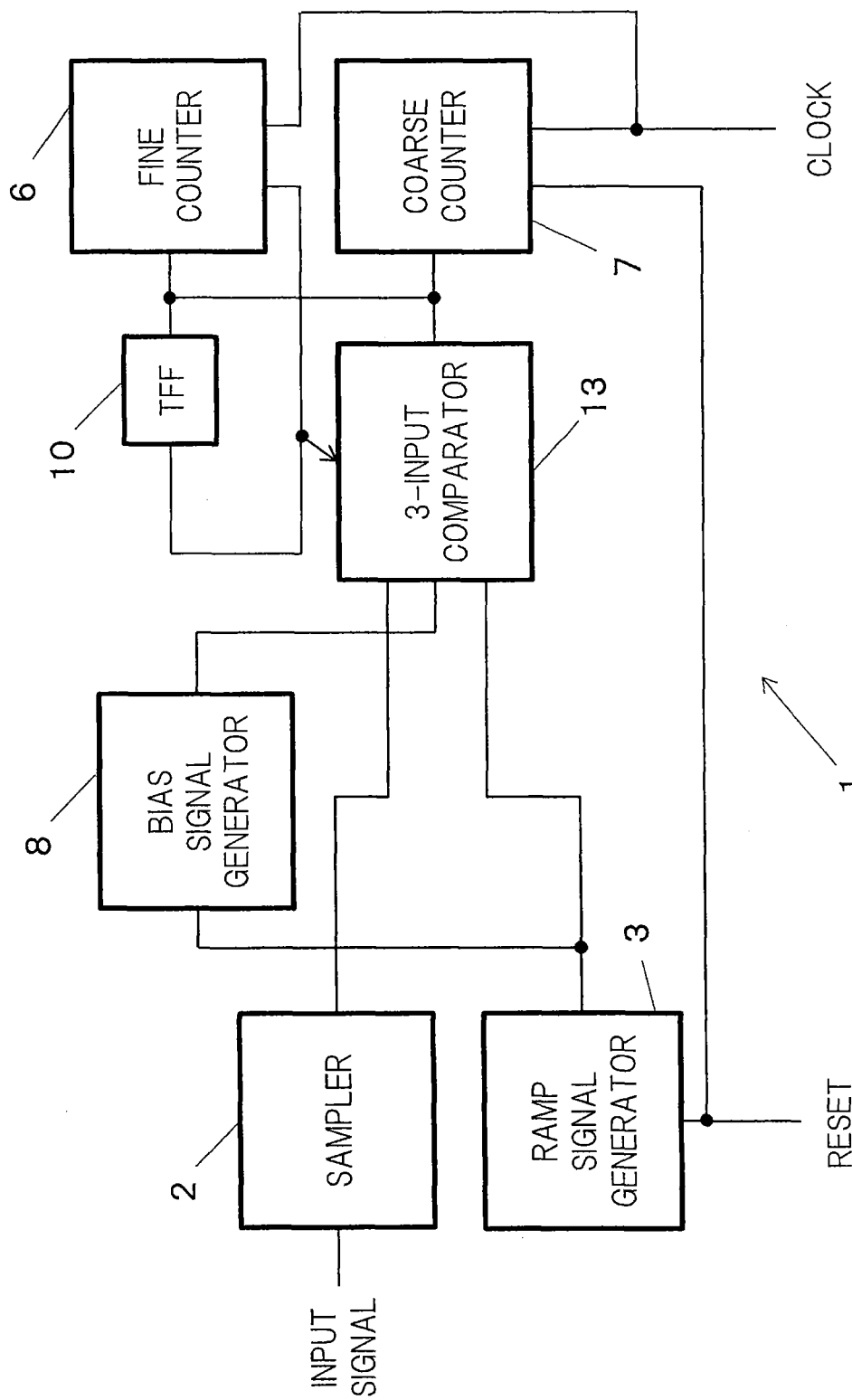
FIG. 8 is a block diagram of an analog-to-digital converter 1 having a 3-input comparator 13 in place of the signal switch 9 and the comparator 5 of FIG. 5.

For the reason above, it is considered to use a 3-input comparator 13 into which the signal switch 9 and the comparator 5 of FIG. 2 or 5 are unified. FIG. 8 is a block diagram of an analog-to-digital converter 1 having a 3-input comparator 13 in place of the signal switch 9 and the comparator 5 of FIG. 5. To the 3-input comparator 13, a sampled signal, a ramp signal and a bias signal are input, and also the output signal of the toggle circuit 10 is input. The 3-input comparator 13 selects either the sampled signal or the bias signal based on the logic of the output signal of the toggle circuit 10 and compares the selected signal and the ramp signal.

As to the circuit operation, FIG. 8 is similar to FIG. 5. However, in FIG. 8, the input signal of the comparator 5 does not vary rapidly when the 3-input comparator 13 performs signal switching.

Figure 9:
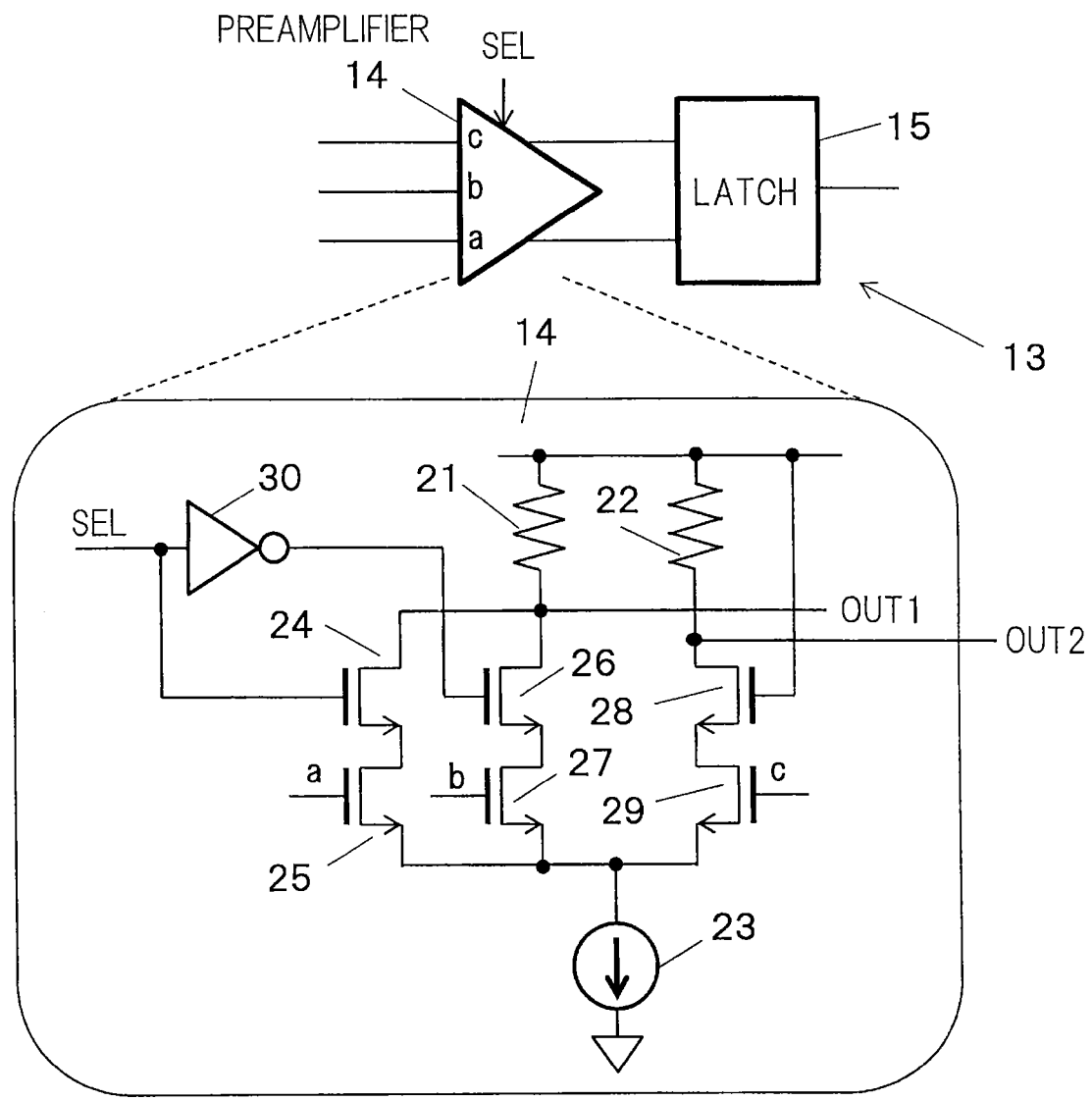
FIG. 9 is a circuit diagram showing an example of the internal configuration of the 3-input comparator 13.

FIG. 9 is a circuit diagram showing an example of the internal configuration of the 3-input comparator 13. The 3-input comparator 13 has a 3-input preamplifier 14 and a latch 15 that latches the output of the preamplifier 14.

The preamplifier 14 is a 3-input differential amplifier and has a first impedance element 21 connected between a power supply voltage node Vcc and a first output node OUT1, a second impedance element 22 connected between the power supply voltage node Vcc and a second output node OUT2, a first transistor 24 and a second transistor 25 connected in series between the first output node OUT1 and one end of a current source 23, a third transistor 26 and a fourth transistor 27 connected in series between the first output node OUT1 and the one end of the current source 23, a fifth transistor 28 and a sixth transistor 29 connected in series between the second output node OUT2 and the one end of the current source 23, and an inverter 30 that inverts the output signal of the toggle circuit 10.

A sampled signal is supplied to the gate of the second transistor 25, a bias signal is supplied to the gate of the fourth transistor 27, and a ramp signal is supplied to the gate of the sixth transistor 29. The output signal of the toggle circuit 10 is supplied to the gate of the first transistor 24 and the output signal of the inverter 30 is supplied to the gate of the third transistor 26. The gate of the fifth transistor 28 is set to a power supply voltage.

In the 3-input comparator 13 of FIG. 9, a current flows through either the first and second transistors 24 and 25 or the third and fourth transistors 26 and 27, depending on the logic of the output signal of the toggle circuit 10. A differential voltage in accordance with difference between the above-mentioned current and a current flowing through the fifth and sixth transistors 28 and 29 is output from the first and second output nodes OUT1 and OUT2.

In the 3-input comparator 13 of FIG. 9, the current flowing through the first impedance element 21 does not vary rapidly when the logic of the output signal of the toggle circuit 10 changes. It is thus considered that temporary signal drop such as shown in FIG. 7 does not occur in principle.

When the 3-input comparator 13 of FIG. 9 is actually designed, the first and third transistors 24 and 26 may be fabricated to be smaller than the second, fourth and sixth transistors 25, 27 and 29. Since the 3-input comparator 13 of FIG. 9 has an offset voltage, an offset cancelling circuit may be added. In the case of adding a circuit for storing only one kind of offset voltage, the circuit may store an offset voltage for a transistor whose gate is supplied with a sampled signal or a ramp signal, but may not need to store an offset voltage for a transistor whose gate is supplied with a bias signal. The reason is that bias-signal offsetting does not affect the conversion accuracy of the analog-to-digital converter 1.

As described above, in the second embodiment, signal switching and comparison are performed with the 3-input comparator 13. Thus, there is no problem such that the signal level of an input signal to the comparator 5 varies rapidly just after signal switching, and hence stable A/D conversion process can be performed.

Third Embodiment

A third Embodiment which will be explained below has two types of comparators 5.

Figure 10:
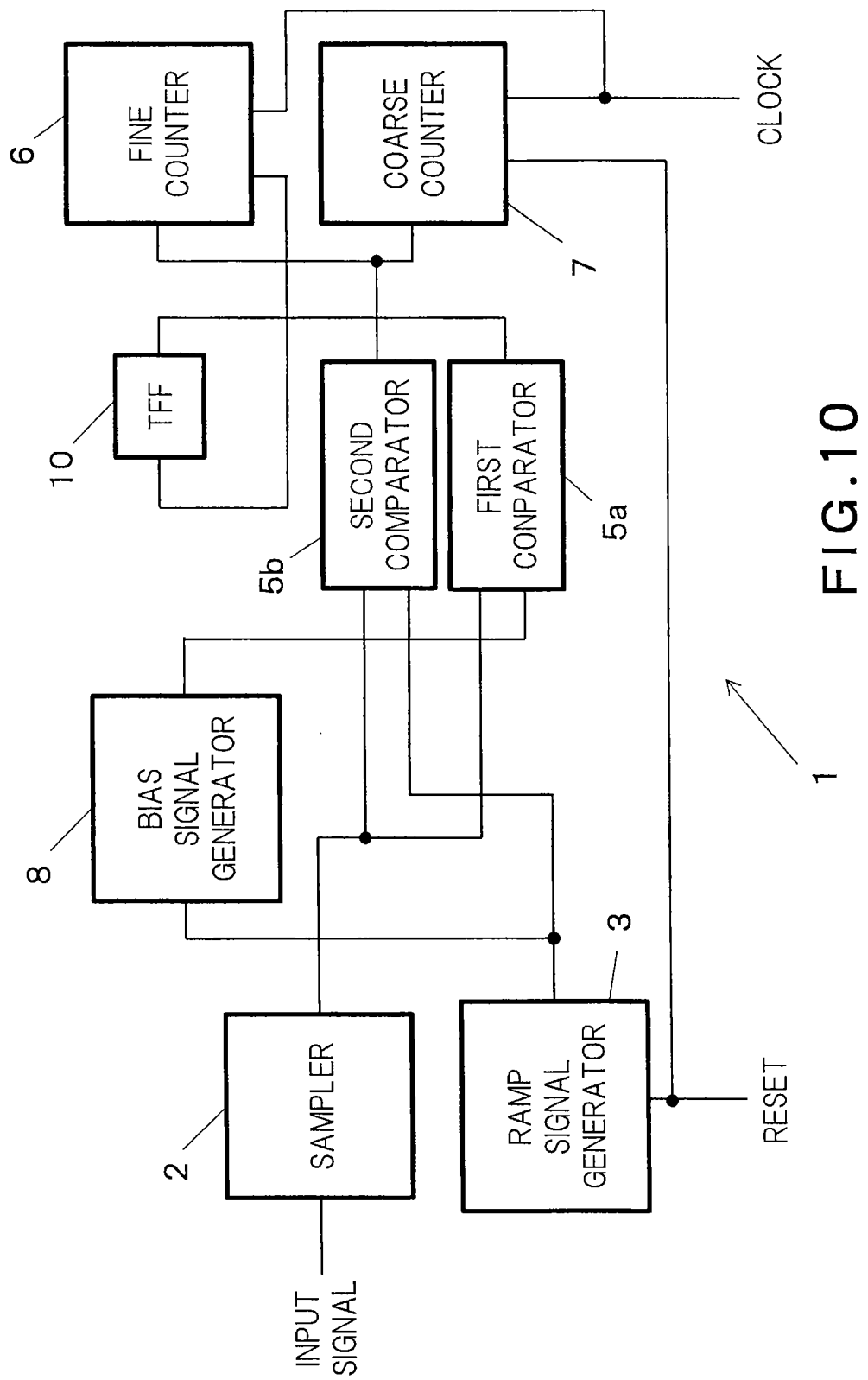
FIG. 10 is a block diagram schematically showing the configuration of an analog-to-digital converter 1 according to a third embodiment.
Figure 11:
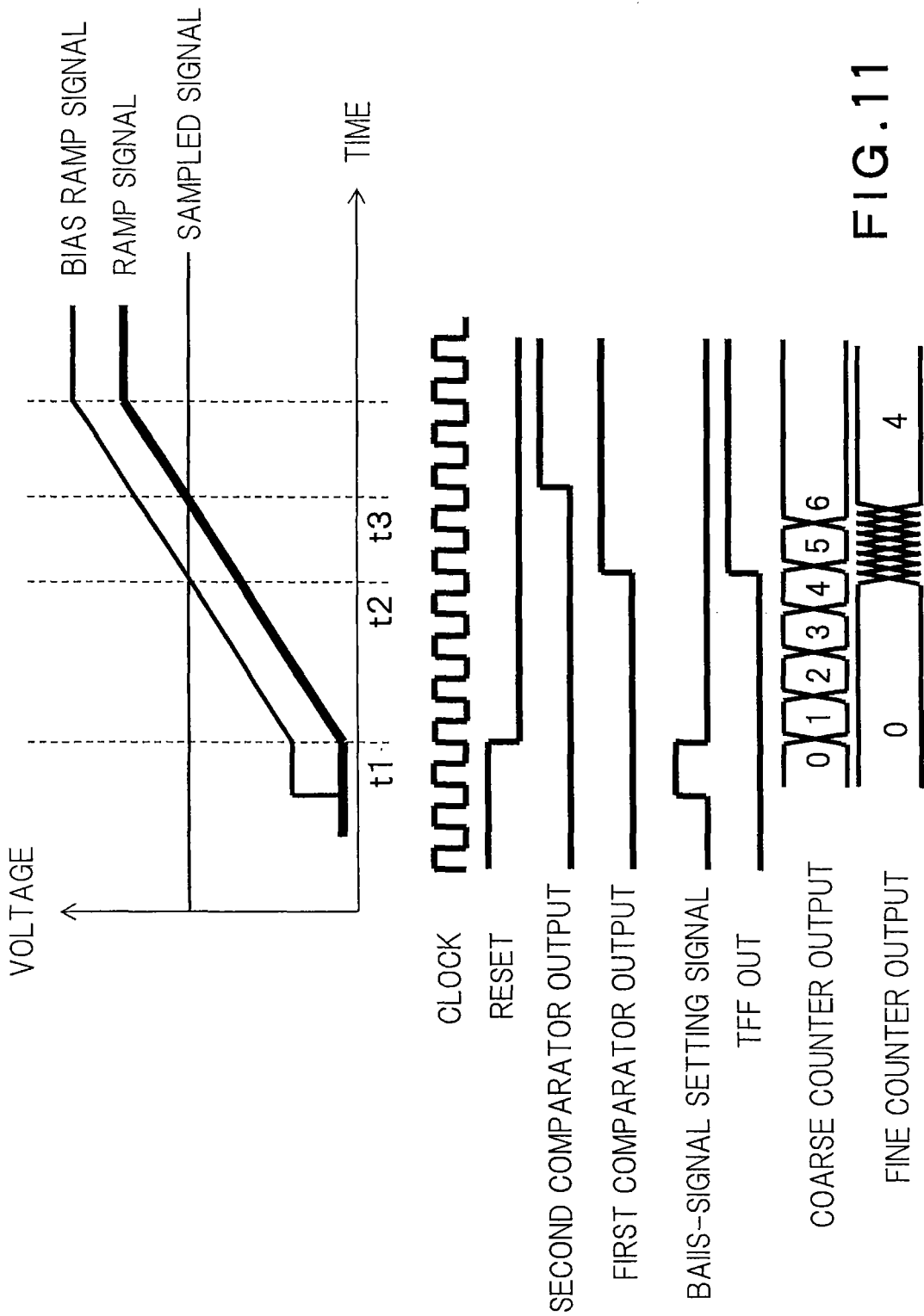
FIG. 11 is a chart of waveforms of the analog-to-digital converter 1 of FIG. 10.

FIG. 10 is a block diagram schematically showing the configuration of an analog-to-digital converter 1 according to the third embodiment. FIG. 11 is a chart of waveforms of the analog-to-digital converter 1 of FIG. 10. The analog-to-digital converter 1 of FIG. 10 is provided with a first comparator 5a and a second comparator 5b in place of the signal switch 9 and the comparator 5 of FIG. 1, the other configuration being the same as FIG. 1.

The first comparator 5a compares the signal levels of a bias signal and a sampled signal to output a signal indicating a comparison result, i.e. to output a comparison signal showing whether the bias signal is larger than the sampled signal. The second comparator 5b compares the signal levels of a ramp signal and the sampled signal to output a signal indicating a comparison result, i.e. to output a comparison signal showing whether the ramp signal is larger than the sampled signal.

When released from a reset mode, the ramp signal generator 3 starts the generation of a ramp signal (time t1 in FIG. 11), firstly, the first comparator 5a starts a comparison process and the Coarse counter 7 starts a count operation. When the output signal of the first comparator 5a is inverted (time t2), that is, when the signal levels of the bias signal and the sampled signal cross each other, the second comparator 5b starts a comparison process and the Fine counter 6 starts a count operation. Thereafter, when the output signal of the second comparator 5b is inverted (time t3), the Coarse counter 7 and the Fine counter 6 both stop the count operation.

In FIG. 5, instead of the signal switch 9 and the comparator 5, a first comparator 5a and a second comparator 5b such as shown in FIG. 10 may be provided.

As described above, in the third embodiment, the first comparator 5a and the second comparator 5b receive different signals and perform a comparison process independently. Thus, there is no need to switch the signals to be compared like the first embodiment. Therefore, the input signals of the first comparator 5a and the second comparator 5b do not vary rapidly, and hence there is no problem such that the signal indicating a comparison result (comparison signal) temporarily fluctuates largely, which is a problem in the first embodiment. Accordingly, a high-resolution A/D conversion process can be performed stably.

Fourth Embodiment

Figure 12:
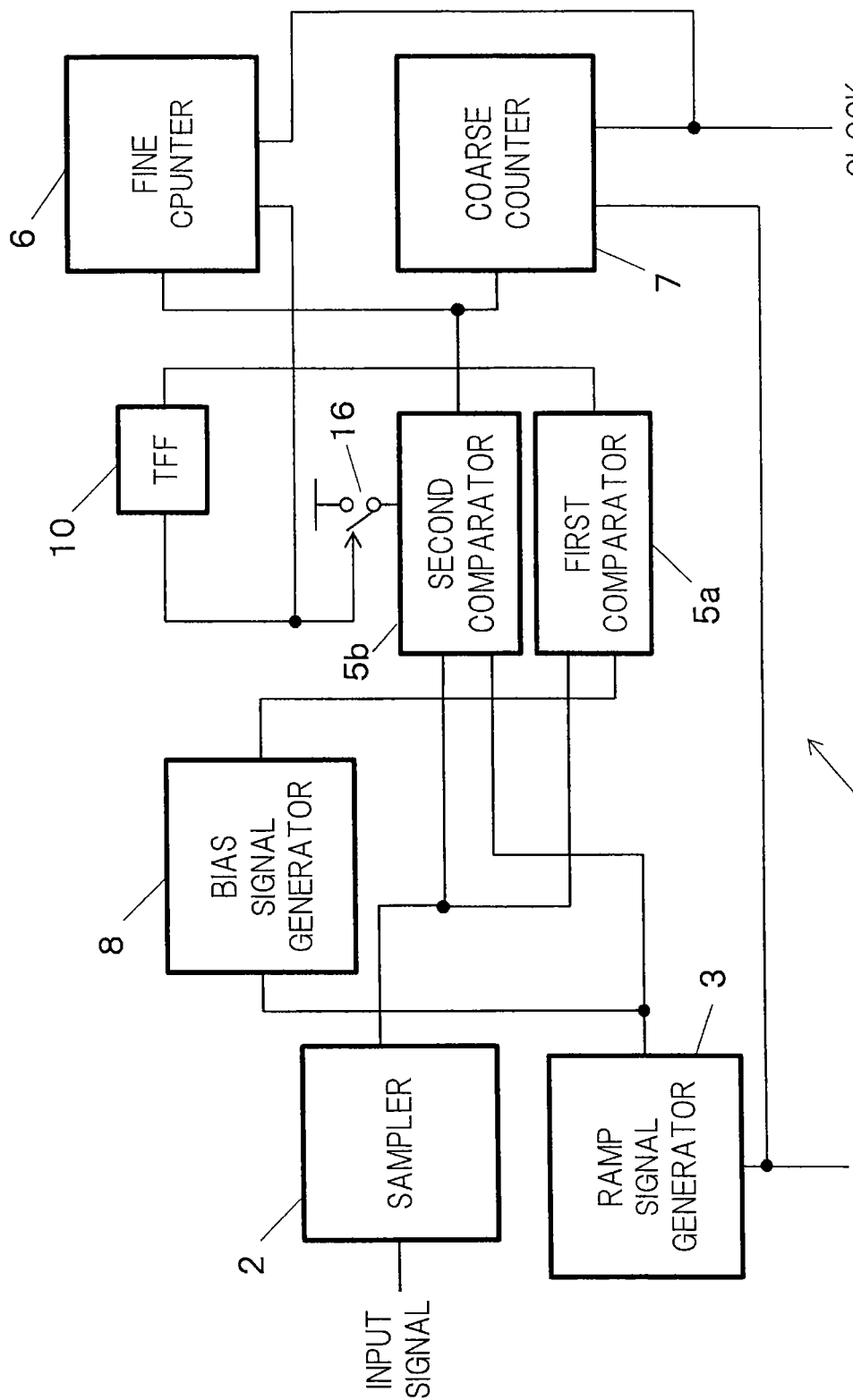
FIG. 12 is a block diagram schematically showing the configuration of an analog-to-digital converter 1 according to a fourth embodiment.

A fourth embodiment which will be explained below is to supply a minimum necessary amount of power to the second comparator 5b explained in the third embodiment FIG. 12 is a block diagram schematically showing the configuration of an analog-to-digital converter 1 according to the fourth embodiment. In addition to the configuration of FIG. 10, the analog-to-digital converter 1 of FIG. 12 has a power switch 16 that is switched to supply a power to the second comparator 5b or not. When the first comparator 5a detects that the signal levels of the bias signal and the sampled signal cross each other and then the toggle circuit 10 outputs a logic-inverted signal, the power switch 16 supplies a power to the second comparator 5b. Accordingly, the second comparator 5b compares the signal levels of the sampled signal with the ramp signal at the timing at which the Fine counter 6 starts a count operation.

As described above, in the fourth embodiment, a power is supplied to the second comparator 5b while the Fine counter 6 is performing a count operation so that the second comparator 5b consumes a minimum amount of power. Therefore, it is possible to reduce a consumed power more than the third embodiment.

Fifth Embodiment

Figure 13:
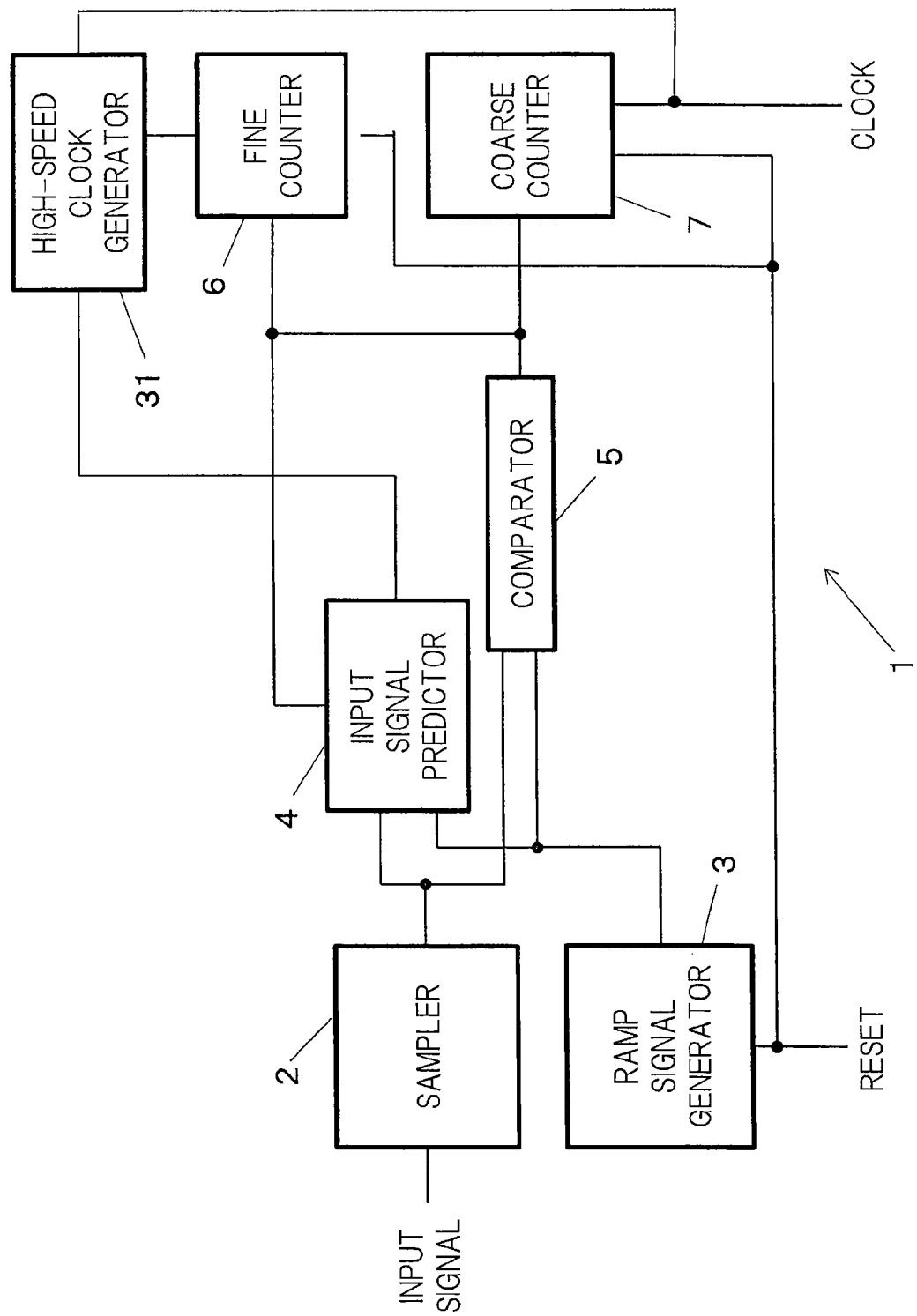
FIG. 13 is a block diagram schematically showing the configuration of an analog-to-digital converter 1 according to a fifth embodiment.

A fifth embodiment which will be explained below is to generate a high-speed second clock signal to be used for operating the Fine counter 6, inside the analog-to-digital converter 1a, FIG. 13 is a block diagram schematically showing the configuration of an analog-to-digital converter 1 according to the fifth embodiment. The analog-to-digital converter 1 of FIG. 13 has a high-speed clock generator 31 in addition to the configuration of FIG. 1. The high-speed clock generator 31 generates a high-speed second clock signal when the input signal predictor 4 generates the prediction signal. In other words, the high-speed clock generator 31 starts the generation of the second clock signal after the signal level of the bias signal obtained by converting the signal level of the ramp signal and the signal level of the sampled signal cross each other. The Fine counter 6 starts a count operation in synchronism with the second clock signal generated by the high-speed clock generator 31.

The second clock signal is a higher speed signal than the first clock signal that operates the Coarse counter 7. It is thus conceivable, as a circuit for generating the second clock signal, to provide a multi-phase clock generator for generating multi-phase clock signals obtained by shifting a reference clock signal little by little and a decoder for sequentially selecting the multi-phase clock signals to generate the second clock signal. However, this results in a complicated circuit configuration. Therefore, this embodiment is provided with the high-speed clock generator 31 that generates the second clock signal with a simple circuit configuration.

Figure 14:
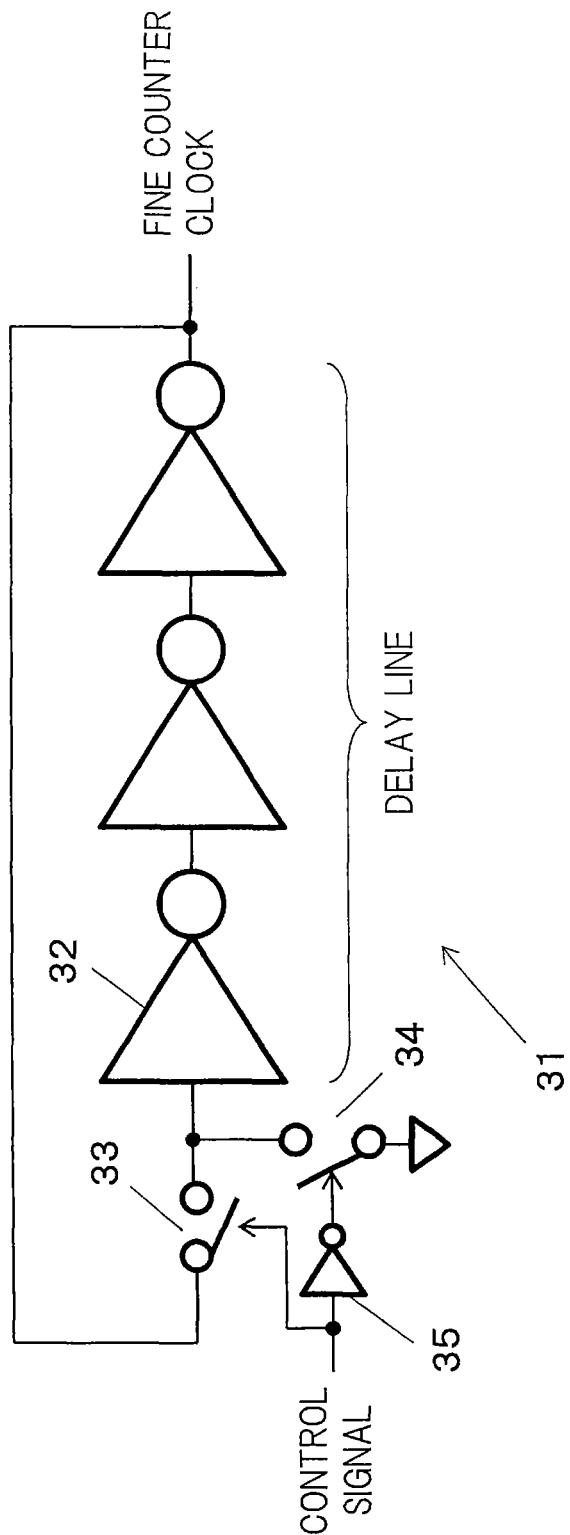
FIG. 14 is a circuit diagram showing an example of the internal configuration of a high-speed clock generator 31.

FIG. 14 is a circuit diagram showing an example of the internal configuration of the high-speed clock generator 31. The high-speed clock generator 31 of FIG. 14 has plural stages of series-connected inverters 32, a first switch 33 connected between the output node of the last-stage inverter 32 and the input node of the first-stage inverter 32, a second switch 34 connected between the input node of the first-stage inverter 32 and a ground node, and an inverter 35 that inverts a control signal.

The control signal of FIG. 14 is a prediction signal generated by the input signal predictor 4 and is a signal that becomes a high level signal when the signal levels of the bias signal and the sampled signal cross each other, for example.

The first switch 33 and the second switch 34 are switched to be on or off exclusively by the control signal. In detail, until the signal levels of the bias signal and the sampled signal cross each other, the first switch 33 is off while the second switch 34 is on. Thus, the high-speed clock generator 31 is put into an operation halt state. When the signal levels of the bias signal and the sampled signal cross each other, the first switch 33 is turned on while the second switch 34 is turned off. Thus, the high-speed clock generator 31 becomes an oscillator having plural stages of ring inverters 32, thereby performing the generation of a high-speed second clock signal.

For generation of the second clock signal with the plural stages of inverters 32, it is required to connect at least three or more of an odd number of inverters 32 in a ring shape. The frequency of the second clock signal is decided by the signal transfer delay time of each inverter 32 and the number of connected stages.

When the plural stages of inverters 32 have a delay time td, the second clock signal has a frequency ½td. Desired A/D conversion can be performed by appropriately setting this delay amount. For example, when the Fine counter 6 has a resolution of M bits and one clock is expressed as Δt, a delay amount td of the plural stages of inverters 32 is expressed by the following formula (3).

$$td = \Delta t / 2^{M+1} \quad (3)$$

As described above, in the fifth embodiment, the second clock signal for operating the Fine counter 6 is generated by the high-speed clock generator 31 inside the analog-to-digital converter 1. There is thus no need to input a high-speed clock signal from outside, and hence noises and timing shift can be prevented. Moreover, by providing the high-speed clock generator 31 inside, the second clock signal can be generated for a minimum necessary time, thereby reducing consumed power.

Sixth Embodiment

When the delay times of plural stages of inverters 32 are used to generate the high-speed second clock signal, as shown in FIG. 14, the frequency may vary due to the variation in delay times of the inverters 32. The variation in delay times of the inverters 32 may occur due to variation in production, change in environment, aging, etc. For this reason, it is preferable to provide a collector for correcting a delay time of the plural stages of inverters 32.

Figure 15:
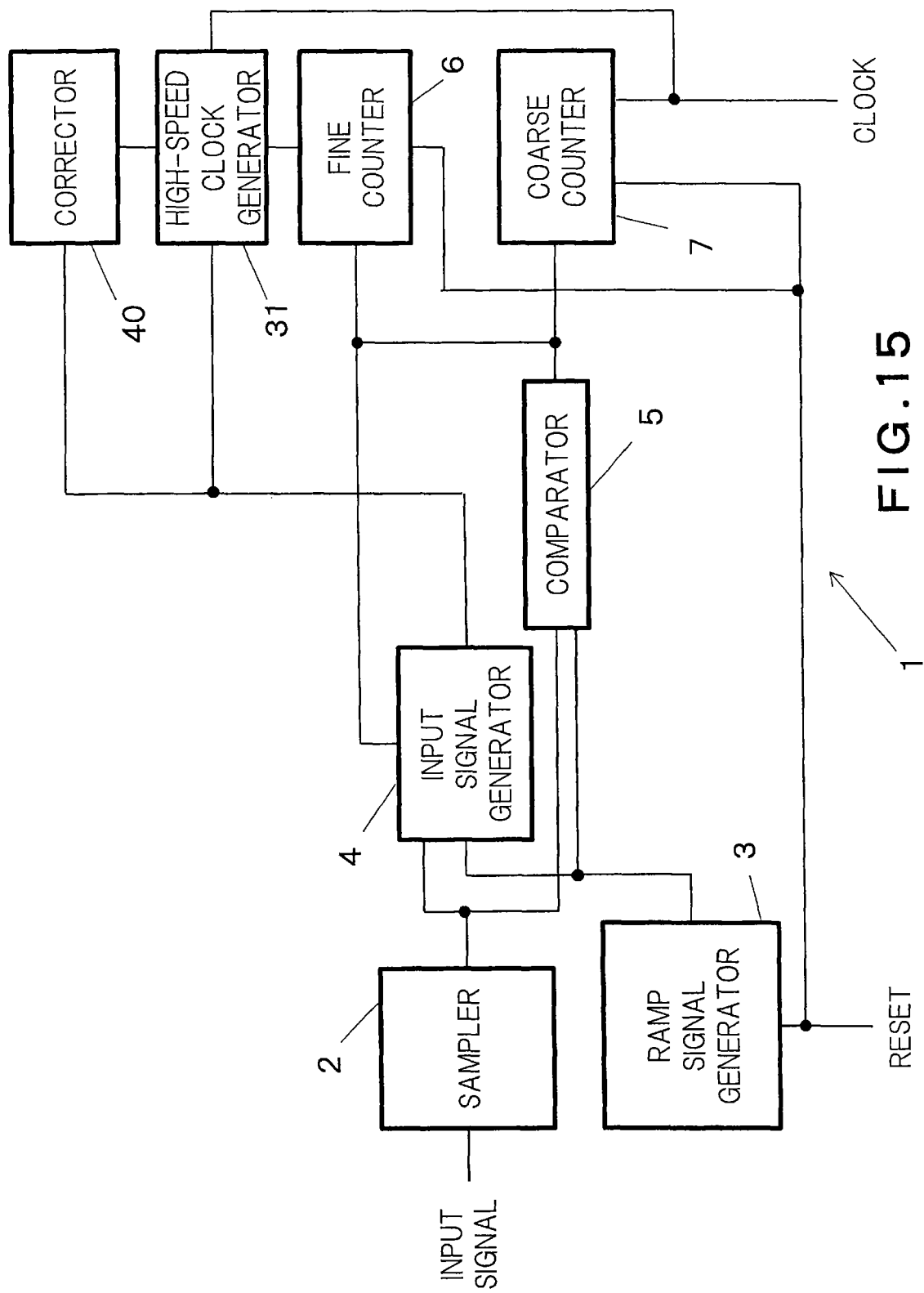
FIG. 15 is a block diagram schematically showing the configuration of an analog-to-digital converter 1 having a corrector 40 in addition to the configuration of FIG. 13.

FIG. 15 is a block diagram schematically showing the configuration of an analog-to-digital converter 1 having a corrector (frequency adjuster) 40 in addition to the configuration of FIG. 13. Similar to the high-speed clock generator 31, the corrector 40 adjusts the frequency of a second clock signal generated by the high-speed clock generator 31 based on the prediction signal generated by the input signal predictor 4.

Figure 16:
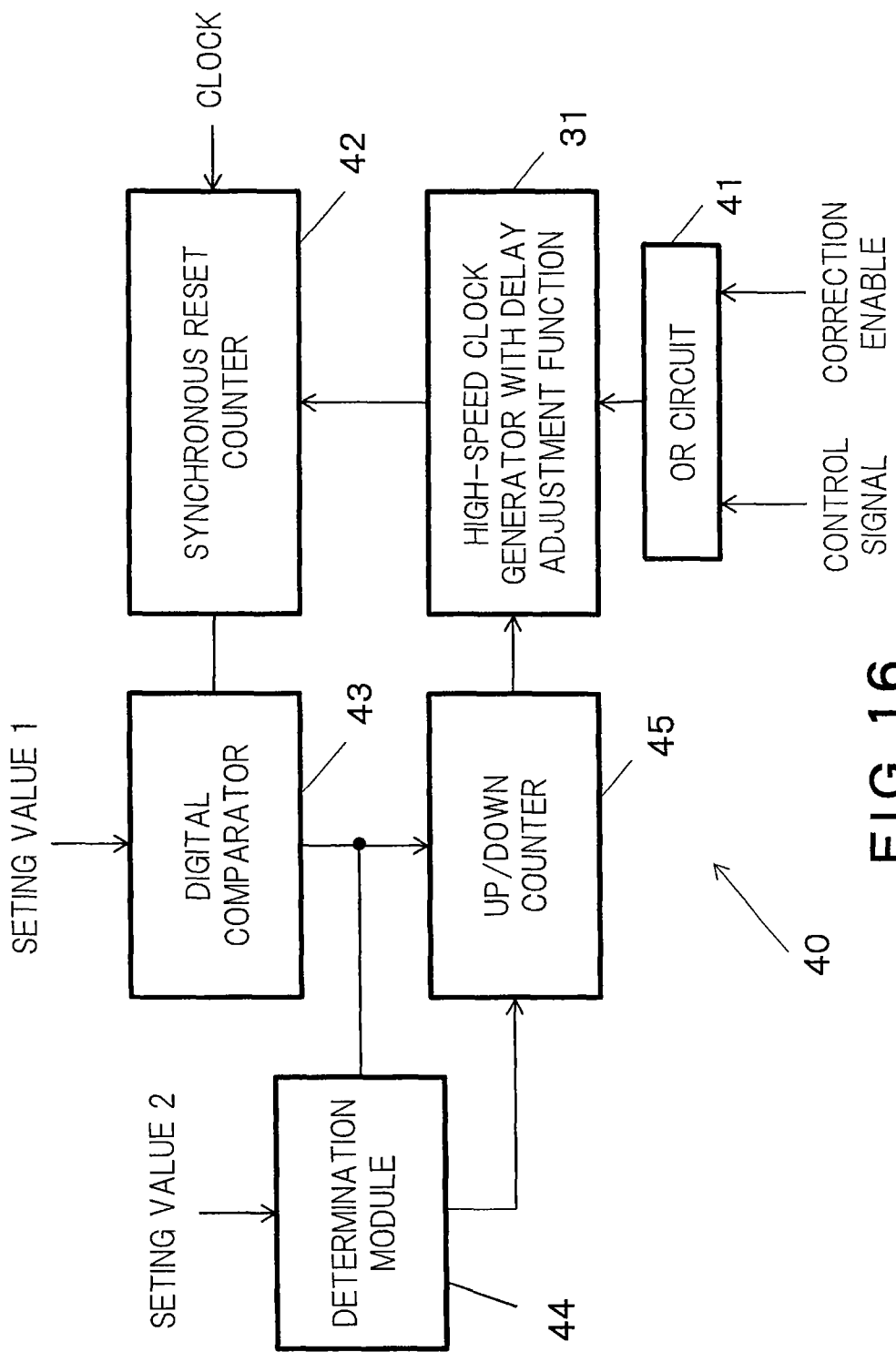
FIG. 16 is a block diagram showing an example of the internal configuration of the corrector 40.

FIG. 16 is a block diagram showing an example of the internal configuration of the corrector 40. The corrector 40 of FIG. 16 has an OR circuit 41, a synchronous reset counter 42, a digital comparator 43, a determination module 44, and an up/down counter 45.

The OR circuit 41 generates a logical sum signal of a control signal corresponding to a prediction signal generated by the input signal predictor 4 and an correction enable signal and supplies the logical sum signal to the high-speed clock generator 31. Accordingly, the high-speed clock generator 31 generates a second clock signal when the prediction signal is input or the correction enable signal is input.

The synchronous reset counter 42 continues a count-up operation in synchronism with the second clock signal generated by the high-speed clock generator 31. The synchronous reset counter 42 is reset by a clock signal from outside (hereinafter, an external clock signal). The external clock signal has an extremely lower frequency than the second clock signal. Therefore, the synchronous reset counter 42 counts the cycles of the second clock signal generated by the high-speed clock generator 31, within one cycle of the external clock signal.

The digital comparator 43 compares a count value of the synchronous reset counter 42 and a first set value to output 1 if both are equal to each other whereas 0 if both are not equal to each other, for example.

The up/down counter 45 performs a count-up operation while the digital comparator 43 is outputting 0 whereas performs a count-down operation while the digital comparator 43 is outputting 1, for example.

The determination module 44 counts the number of times the output of the digital comparator 43 has changed from 0 to 1 and outputs 1 if the count value becomes equal to a set value 2, for example. When the output of the determination module 44 becomes 1, the up/down counter 45 stops a count operation and the corrector 40 finishes a correction sequence.

The output of the up/down counter 45 is used as a control signal of FIG. 14. In detail, when the up/down counter 45 starts a count-up operation, in FIG. 14, the first switch 33 is turned on while the second switch 34 is turned off so that the high-speed clock generator 31 raises the frequency. On the contrary, when the up/down counter 45 starts a count-down operation, in FIG. 14, the first switch 33 is turned off while the second switch 34 is turned on so that the high-speed clock generator 31 lowers the frequency.

Figure 17:
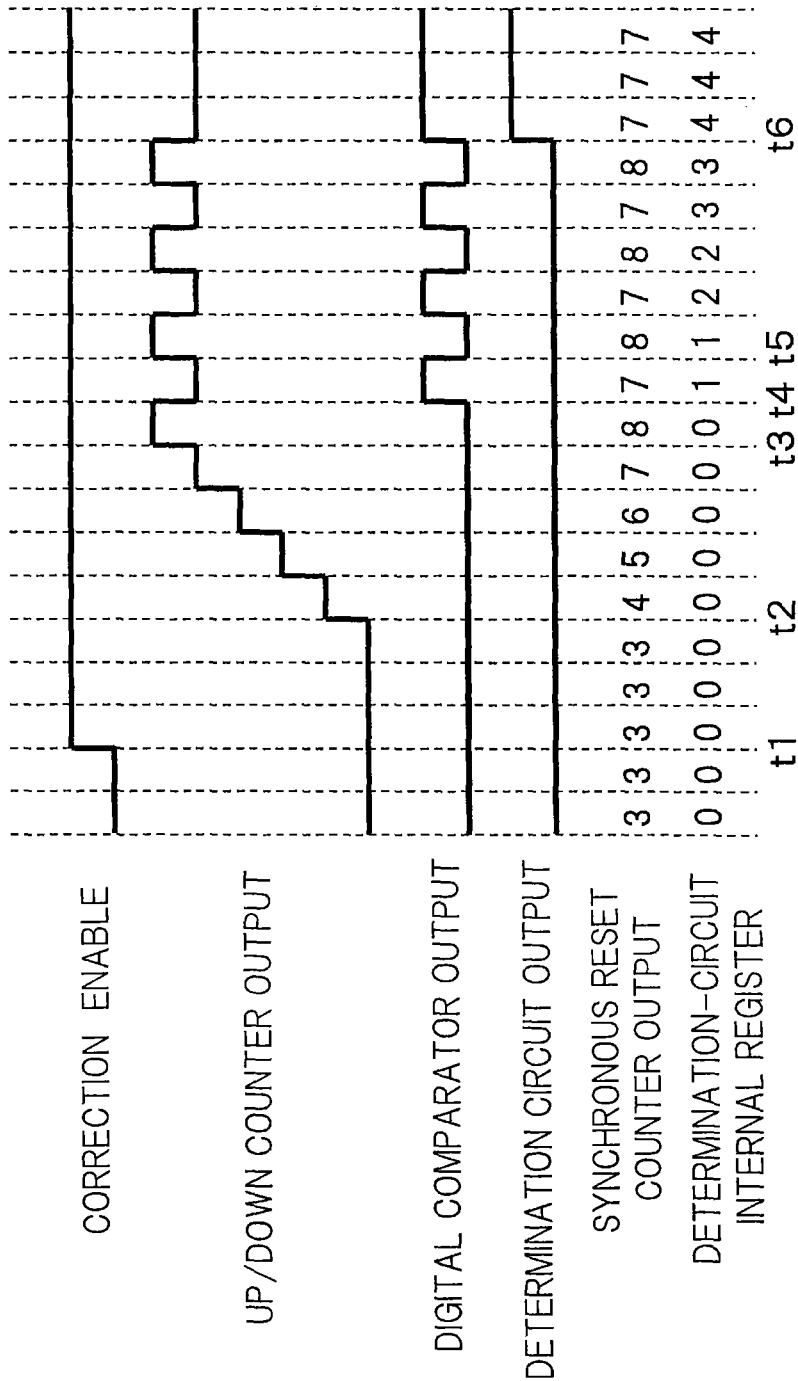
FIG. 17 is a timing chart of FIG. 16.

FIG. 17 is a timing chart of FIG. 16. Hereinafter, the operation of the corrector 40 will be explained with FIG. 17. When a correction enable signal becomes high at time t1, the corrector 40 starts a correction process with the frequency of the second clock signal. In the example of FIG. 17, the initial value of the synchronous reset counter 42 is set to 3.

At time t2 and thereafter, the synchronous reset counter 42 performs a count-up operation. In the beginning, since the digital comparator 43 outputs 0, the up/down counter 45 performs a count-up operation.

At time t3, the synchronous reset counter 42 counts 8, and hence the output of the digital comparator 43 changes to be 1 (time t4), which causes the up/down counter 45 to perform a count-down operation. Thus, the high-speed clock generator 31 performs a correction process to lower the frequency of the second clock signal. The synchronous reset counter 42 performs a count-down operation when the frequency of the second clock signal generated by the high-speed clock generator 31 is lowered. Accordingly, the output of the digital comparator 43 is changed to be 0 again (time t5), and hence the up/down counter 45 performs a count-up operation.

When the synchronous reset counter 42 and the up/down counter 45 have repeated count-up and count-down operations for several times, at time t6, the output of the determination module 44 becomes high.

As described above, the sixth embodiment is provided with the corrector 40 that performs frequency adjustments of the high-speed clock generator 31 that generates the second clock signal for operating the Fine counter 6. Therefore, even if there is variation in delay time of the inverters 32 in the high-speed clock generator 31, the second clock signal of a desired frequency can be generated and high-resolution A/D conversion process can be performed.

In the above-mentioned first to sixth embodiments, an example of providing the ramp signal generator 3 inside the analog-to-digital converter 1 has been shown. However, the ramp signal generator 3 may be provided outside the analog-to-digital converter 1. In this case, a ramp signal generated by an external ramp signal generator is input to the analog-to-digital converter 1.

Seventh Embodiment

The analog-to-digital converters 1 explained in the above first to sixth embodiments can be built in an image sensor.

Figure 18:
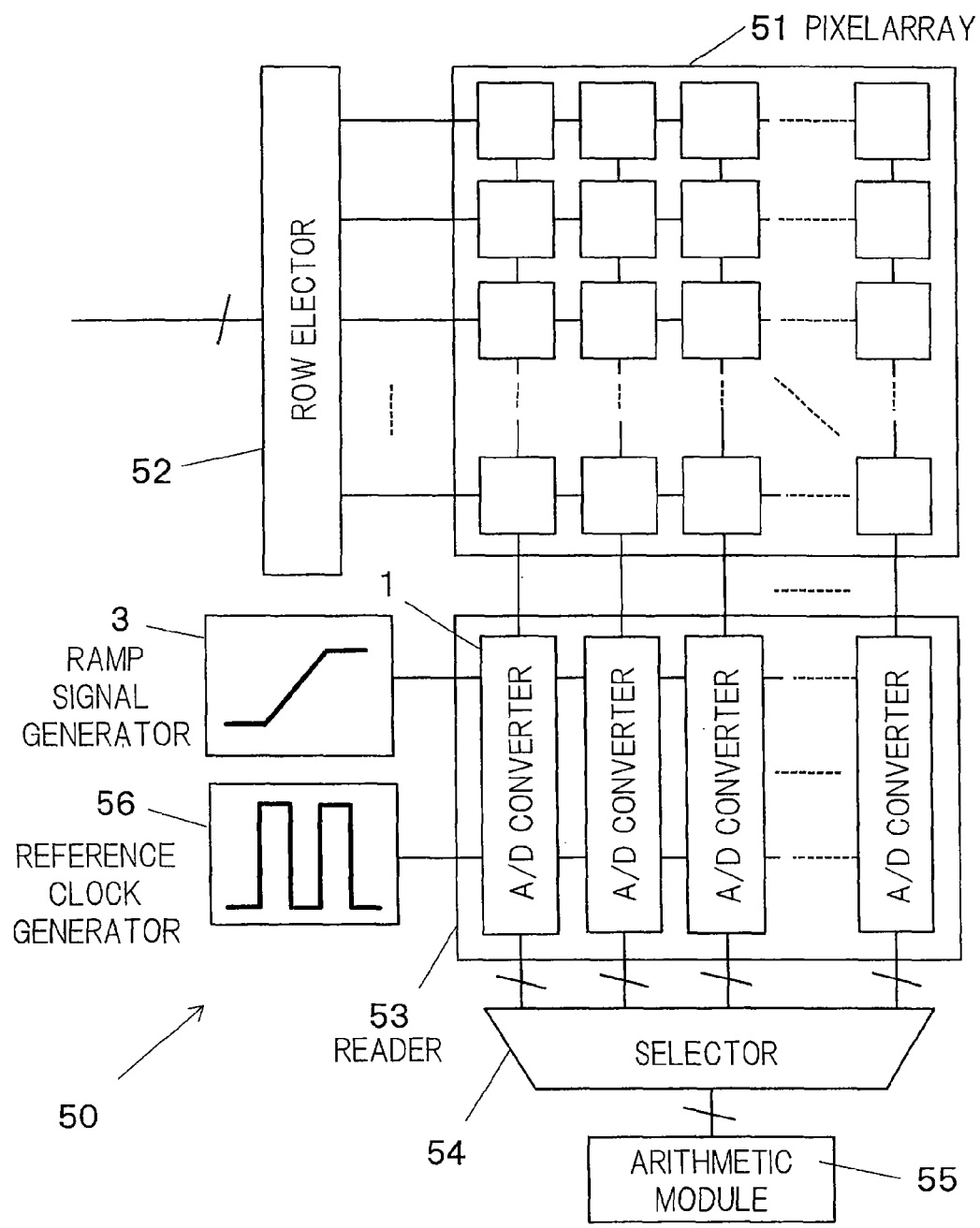
FIG. 18 is a block diagram of schematically showing the configuration of an image sensor 50 having the analog-to-digital converter 1 of any one of the first to sixth embodiments.

FIG. 18 is a block diagram of schematically showing the configuration of an image sensor 50 having the analog-to-digital converter 1 of any one of the first to sixth embodiments. The image sensor 50 of FIG. 18 is a CMOS sensor and provided with a pixel array 51, a row selector 52, a reader 53, a selector 54, an arithmetic module 55, a ramp signal generator 3, and a reference clock generator 56.

The pixel array 51 has a plurality of CMOS sensors arranged in row and column directions. From among the CMOS sensors, the row selector 52 selects a plurality of CMOS sensors aligned in a specific row.

The reader 53 has a plurality of analog-to-digital converters 1 for the number of CMOS sensors aligned in a column direction in the pixel array 51. These analog-to-digital converters 1 correspond to the analog-to-digital converter 1 of any one of the first to sixth embodiments. The ramp signal generator 3 has the identical internal configuration for the analog-to-digital converters 1, and hence can be used for all of the analog-to-digital converters 1. Thus, the ramp signal generator 3 is not contained in each analog-to-digital converter 1 of FIG. 18 but provided separately from the reader 53.

The reference clock generator 56 generates a first clock signal for operating the Coarse counter 7 in each analog-to-digital converter 1. A second clock signal for operating the Fine counter 6 may also be generated by the reference clock generator 56.

The count value of the Coarse counter 7 in each analog-to-digital converter 1 becomes an A/D conversion value. It is the arithmetic module 55 to obtain a final A/D conversion value by averaging or the like the count value of the Coarse counter 7. The arithmetic process of the arithmetic module 55 is the same for all of the analog-to-digital converters 1. Thus, in FIG. 18, the arithmetic module 55 is provided outside the analog-to-digital converters 1. The selector 54 selects the output signal of any one of the analog-to-digital converters 1 and supplies the selected output signal to the arithmetic module 55. The selector 54 selects the analog-to-digital converters 1 one by one, and hence the arithmetic module 55 obtains A/D conversion values of all of the analog-to-digital converters 1 one by one.

As described above, the analog-to-digital converter 1 of each of the first to sixth embodiments can perform an A/D conversion process at high resolution without increasing power consumption. Therefore, by applying the analog-to-digital converter 1 to the image sensor 50 having a plurality of built-in analog-to-digital converters 1 as shown in FIG. 18, the features of high resolution and low power consumption can be more fully utilized.

Figure 19:
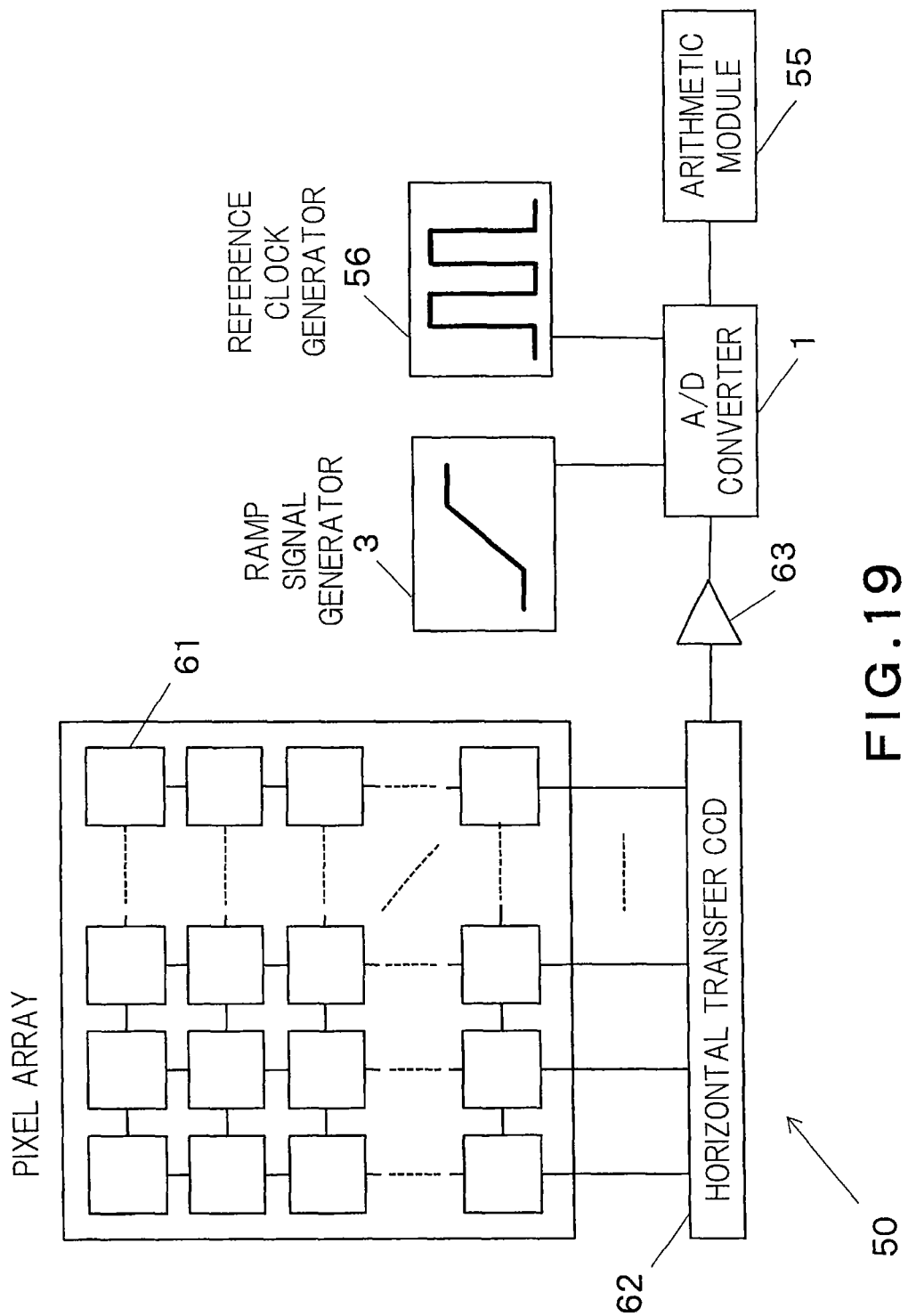
FIG. 19 is a plan view of an image sensor 50 having built-in CCDs.

FIG. 18 shows an example of CMOS sensor. However, the image sensor 50 in this embodiment is also applicable to CCDs (Charge Coupled Devices). FIG. 19 is a plan view of an image sensor 50 having built-in CCDs. The image sensor 50 of FIG. 19 has a pixel array 61 of vertical transfer CCDs, a horizontal transfer CCD 62, a charge-to-voltage converter 63, an A/D converter 1, a ramp signal generator 3, a reference clock generator 56, and an arithmetic module 55.

The pixel array 61 has a photoelectric converter and transfer gate each provided per pixel, and vertical transfer CCDs provided per column.

In the image sensor 50 of FIG. 19, electric signals obtained by photoelectric conversion at a plurality of photoelectric converters in each row pass through the vertical transfer CCDs and are transferred to the horizontal transfer CCD 62. Thereafter, the electric signals are sequentially transferred through the horizontal transfer CCD 62 and subjected to A/D conversion by the A/D converter 1, after converted into voltage signals by the charge-to-voltage converter 63.

The image sensor 50 of FIG. 18, that is a CMOS sensor, requires a plurality of A/D converters 1. By contrast, the image sensor 50 of FIG. 19 having CCDs requires only one A/D converter 1.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An analog-to-digital converter comprising:
a sampler to hold a sampled signal obtained by sampling an input signal for each specific time;
an input signal predictor to generate a prediction signal at predetermined timing before a signal level of a ramp signal that monotonically increases or monotonically decreases with time crosses a signal level of the sampled signal;
a comparator to compare signal levels of the ramp signal and the sampled signal to output a comparison signal showing whether the signal level of the ramp signal is larger than the signal level of the sampled signal;
a first counter to perform a count operation in synchronism with a first clock signal within a period from start of a comparison operation by the comparator to generation of the prediction signal; and
a second counter to perform a count operation in synchronism with a second clock signal having a higher frequency than the first clock signal after the generation of the prediction signal and to increase or decrease a count value in accordance with the comparison signal.

2. The converter of claim 1, wherein the input signal predictor comprises a bias signal generator to generate a bias signal obtained by converting the signal level of the ramp signal or the sampled signal,
wherein the comparator compares the signal levels of the bias signal and the sampled signal or the signal levels of the bias signal and the ramp signal until the generation of the prediction signal, and compares the signal levels of the ramp signal and the sampled signal after the generation of the prediction signal.

3. The converter of claim 2 comprising a signal switch to select the bias signal and either the ramp signal or the sampled signal depending on whether the prediction signal is generated,
wherein the comparator compares signal levels of a signal selected by the signal switch and either of the ramp signal or the sampled signal.

4. The converter of claim 2, wherein the comparator comprises:
three input terminals to which the sampled signal, the ramp signal and the bias signal are input, respectively;
an output terminal which outputs the comparison signal showing whether the signal level of the ramp signal is larger than the signal level of the sampled signal, or whether the signal level of the bias signal is larger than the signal level of the sampled signal or the ramp signal; and
a differential amplifier to switch the comparison signal outputted from the output terminal depending on whether the prediction signal is generated.

5. The converter of claim 1, wherein the first counter starts the count operation when a reset signal has a specific logic.

6. The converter of claim 5 further comprising a ramp signal generator to generate the ramp signal when the reset signal has the specific logic.

7. The converter of claim 1 further comprising a clock generator to generate the second clock signal when the prediction signal is generated.

8. The converter of claim 7 further comprising a frequency adjuster to adjust a frequency of the second clock signal generated by the clock generator.

9. An image sensor comprising:
a photoelectric converter to perform photoelectric conversion to generate electric signals; and
an analog-to-digital converter according to claim 1 to generate a digital signal in accordance with the electric signals, using the electric signals as the input signal.

10. The image sensor according to claim 9 comprising:
a plurality of photoelectric converters, an m (m being an integer of 1 or more) number of the photoelectric converters being arranged in a first direction and an n (n being an integer of 1 or more) number of the photoelectric converters being arranged in a second direction,
wherein the m number of analog-to-digital converters are provided corresponding to the photoelectric converters arranged in the first direction.

11. The image sensor according to claim 9 comprising:
a plurality of photoelectric converters, an m (m being an integer of 1 or more) number of the photoelectric converters being arranged in a first direction and an n (n being an integer of 1 or more) number of the photoelectric converters being arranged in a second direction;
a first transfer module to sequentially transfer the electric signals in the second direction; and
a second transfer module to sequentially transfer the electric signals transferred by the first transfer module, in the first direction,
wherein the analog-to-digital converter sequentially converts the electric signals transferred by the second transfer module by analog-to-digital conversion.

12. An analog-to-digital converter comprising:
a sampler to hold a sampled signal obtained by sampling an input signal for each specific time;
an input signal predictor to generate a prediction signal before a signal level of a ramp signal that monotonically increases or monotonically decreases with time crosses a signal level of the sampled signal;
a comparator to compare the signal levels of the ramp signal and the sampled signal to output a comparison signal showing whether the signal level of the ramp signal is larger than the signal level of the sampled signal;
a first counter to perform a count operation in synchronism with a first clock signal when the comparator starts a comparison operation; and
a second counter to perform a count operation in synchronism with a second clock signal having a higher frequency than the first clock signal after the generation of the prediction signal and to increase or decrease a count value in accordance with the comparison signal,
wherein the input signal predictor comprises a bias signal generator to generate a bias signal obtained by converting the signal level of the ramp signal or the sampled signal, and
the comparator comprises:
a first comparator to compare signal levels of the sampled signal or ramp signal and the bias signal to output a comparison signal showing whether the signal level of the bias signal is larger than the signal level of the sampled signal or the ramp signal; and
a second comparator to compare signal levels of the sampled signal and the ramp signal to output a comparison signal showing whether the signal level of the ramp signal is larger than the signal level of the sampled signal,
wherein the second counter starts a count operation when the first comparator detects that the signal level of the sampled signal or ramp signal cross with the signal level of the bias signal and increases or decreases a count value in accordance with the comparison signal of the second comparator.

13. An analog-to-digital converter comprising:

a sampler to hold a sampled signal obtained by sampling an input signal for each specific time;

an input signal predictor to generate a prediction signal before a signal level of a ramp signal that monotonically increases or monotonically decreases with time crosses a signal level of the sampled signal;

a comparator to compare the signal levels of the ramp signal and the sampled signal to output a comparison signal showing whether the signal level of the ramp signal is larger than the signal level of the sampled signal;

a first counter to perform a count operation in synchronism with a first clock signal when the comparator starts a comparison operation; and a second counter to perform a count operation in synchronism with a second clock signal having a higher frequency than the first clock signal after the generation of the prediction signal and to increase or decrease a count value in accordance with the comparison signal of the comparator, wherein the input signal predictor comprises a bias signal generator to generate a bias signal obtained by converting the signal level of the ramp signal or the sampled signal, and the comparator comprises:

a first comparator to compare signal levels of the sampled signal or ramp signal and the bias signal to output a signal showing whether the signal level of the bias signal is larger than the signal level of the sampled signal or the ramp signal;

a second comparator to compare signal levels of the sampled signal and the ramp signal to output a signal showing whether the signal level of the ramp signal is larger than the signal level of the sampled signal; and a power switch to be switched to supply a power to the second comparator or not based on the comparison signal of the first comparator, wherein the second counter starts a count operation when the first comparator detects that the signal level of the sampled signal or ramp signal crosses with the signal level of the bias signal and increases or decreases a count value in accordance with the comparison signal of the second comparator.

\* \* \* \* \*